US011509276B2

(12) United States Patent
Choi et al.

(10) Patent No.: US 11,509,276 B2
(45) Date of Patent: Nov. 22, 2022

(54) MULTILAYER FILTER INCLUDING A RETURN SIGNAL REDUCING PROTRUSION

(71) Applicant: AVX Corporation, Fountain Inn, SC (US)

(72) Inventors: Kwang Choi, Simpsonville, SC (US); Marianne Berolini, Greenville, SC (US)

(73) Assignee: KYOCERA AVX Components Corporation, Fountain Inn, SC (US)

( * ) Notice: Subject to any disclaimer, the term of this patent is extended or adjusted under 35 U.S.C. 154(b) by 0 days.

(21) Appl. No.: 16/718,270

(22) Filed: Dec. 18, 2019

(65) Prior Publication Data

US 2020/0204137 A1    Jun. 25, 2020

Related U.S. Application Data

(60) Provisional application No. 62/782,482, filed on Dec. 20, 2018.

(51) Int. Cl.
*H01F 17/00* (2006.01)
*H03H 1/00* (2006.01)
(Continued)

(52) U.S. Cl.
CPC ............ *H03H 1/00* (2013.01); *H03H 7/0115* (2013.01); *H03H 7/0161* (2013.01); (Continued)

(58) Field of Classification Search
CPC ........ H03H 1/00; H03H 7/0115; H03H 7/075; H03H 7/1766; H03H 2001/0085; H03H 1/1775; H04H 7/0161
See application file for complete search history.

(56) References Cited

U.S. PATENT DOCUMENTS 5,357,227 A    10/1994  Tonegawa et al.
6,529,101 B2    3/2003  Tojyo et al.
(Continued)

FOREIGN PATENT DOCUMENTS

CN         1855613 A    11/2006
CN       102354777 A     2/2012
(Continued)

OTHER PUBLICATIONS

Dissertation of Seunghyun Eddy Hwang to Georgia Institute of Technology entitled "Characterization and Design of Embedded Passive Circuits for Applications Up to Millimeter-Wave Frequency," dated Aug. 2011, 196 pages.
(Continued)

*Primary Examiner* — Dinh T Le
(74) *Attorney, Agent, or Firm* — Dority & Manning, P.A.

(57) ABSTRACT

A multilayer filter may include a signal path having an input, an output, and a conductive layer overlying at least one of a plurality of dielectric layers. The conductive layer may be elongated in the first direction and may have a first edge aligned with the first direction and a second edge parallel with the first edge. The conductive layer may include a protrusion extending in the second direction and having an end edge that is parallel with the first edge and offset from the first edge in the second direction by a protrusion length that is greater than about 50 microns. The multilayer filter may include an inductor that is electrically connected at a first location with the signal path and electrically connected at a second location with at least one of the signal path or a ground.

23 Claims, 29 Drawing Sheets

(51) Int. Cl.
    *H03H 7/01*      (2006.01)
    *H03H 7/075*     (2006.01)
(52) U.S. Cl.
    CPC .......... *H03H 7/075* (2013.01); *H03H 7/1766* (2013.01); *H03H 7/1775* (2013.01); *H03H 2001/0085* (2013.01)

(56) References Cited

U.S. PATENT DOCUMENTS

| | | |
|---|---|---|
| 6,556,416 B2 | 4/2003 | Kunihiro |
| 6,720,848 B2 | 4/2004 | Okamura et al. |
| 6,734,755 B2 | 5/2004 | Cites et al. |
| 6,771,148 B2 | 8/2004 | Okamura et al. |
| 6,791,435 B2 | 9/2004 | Shingaki et al. |
| 6,900,708 B2 | 5/2005 | White et al. |
| 6,958,667 B2 | 10/2005 | Mizoguchi et al. |
| 6,970,057 B2 | 11/2005 | Lin et al. |
| 7,068,124 B2 | 6/2006 | White et al. |
| 7,098,760 B2 | 8/2006 | Okamura et al. |
| 7,119,639 B2 | 10/2006 | Okamura et al. |
| 7,126,444 B2 | 10/2006 | Fukinaga et al. |
| 7,187,109 B2 | 3/2007 | Tikka et al. |
| 7,239,219 B2 | 7/2007 | Brown et al. |
| 7,239,221 B2 | 7/2007 | Okamura et al. |
| 7,245,194 B2 | 7/2007 | Muto |
| 7,268,648 B2 | 9/2007 | Okamura et al. |
| 7,312,676 B2 | 12/2007 | Kundu |
| 7,592,885 B2 | 9/2009 | Sekine et al. |
| 7,612,634 B2 | 11/2009 | Iwata |
| 7,652,554 B2 | 1/2010 | Moriai et al. |
| 7,795,995 B2 | 9/2010 | White et al. |
| 7,907,034 B2 | 3/2011 | Taniguchi |
| 8,013,688 B2 | 9/2011 | White et al. |
| 8,067,723 B2 | 11/2011 | Yamada et al. |
| 8,106,722 B2 | 1/2012 | Shimamura et al. |
| 8,159,313 B2 | 4/2012 | Uchaykin |
| 8,179,210 B2 | 5/2012 | Feichtinger |
| 8,378,763 B2 | 2/2013 | Wakata |
| 8,384,013 B2 | 2/2013 | Yamada et al. |
| 8,390,984 B2 | 3/2013 | Liu et al. |
| 8,405,468 B2 | 3/2013 | Uchaykin |
| 8,446,705 B2 | 5/2013 | Ritter et al. |
| 8,451,073 B2 | 5/2013 | Hoeft et al. |
| 8,659,871 B2 | 2/2014 | Togashi et al. |
| 8,754,726 B2 | 6/2014 | Sasaki et al. |
| 9,142,342 B2 | 9/2015 | Haner |
| 9,218,910 B2 | 12/2015 | Kim |
| 9,240,392 B2 | 1/2016 | Hurwitz et al. |
| 9,287,845 B2 | 3/2016 | Fukamachi et al. |
| 9,349,788 B2 | 5/2016 | Hurwitz et al. |
| 9,647,313 B2 | 5/2017 | Marconia et al. |
| 9,698,747 B2 | 7/2017 | Ishizuka |
| 9,935,603 B2 | 4/2018 | Imamura |
| 9,949,373 B2 | 4/2018 | Hurwitz et al. |
| 10,014,843 B2 | 7/2018 | Hurwitz et al. |
| 10,063,211 B2 | 8/2018 | Yehezkely et al. |
| 10,110,196 B2 * | 10/2018 | Mukai .................. H03H 7/0115 |
| 10,200,007 B2 | 2/2019 | Fukae et al. |
| 10,218,330 B2 | 2/2019 | Park et al. |
| 10,236,854 B2 | 3/2019 | Hurwitz et al. |
| 10,277,190 B2 | 4/2019 | Masuda et al. |
| 10,283,566 B2 | 5/2019 | Sel et al. |
| 10,389,329 B2 | 8/2019 | Shiokawa |
| 10,466,335 B2 | 10/2019 | Hurwitz et al. |
| 10,763,214 B2 * | 9/2020 | Kariyazaki ............. H01L 23/66 |
| 10,944,375 B2 * | 3/2021 | Imamura .............. H03H 7/0115 |
| 11,114,993 B2 | 9/2021 | Choi et al. |
| 2006/0055489 A1 | 3/2006 | Okamuara et al. |
| 2007/0085108 A1 | 4/2007 | White et al. |
| 2008/0047743 A1 | 2/2008 | Komatsu et al. |
| 2009/0027141 A1 | 1/2009 | Oshima |
| 2009/0033439 A1 | 2/2009 | Igarashi |
| 2014/0153154 A1 | 6/2014 | Choi et al. |
| 2015/0296617 A1 | 10/2015 | Hurwitz et al. |
| 2016/0126003 A1 | 5/2016 | Lim |
| 2016/0307702 A1 | 10/2016 | Tanaka et al. |
| 2017/0133997 A1 | 5/2017 | Imamura |
| 2020/0203075 A1 | 6/2020 | Choi et al. |
| 2020/0204138 A1 | 6/2020 | Choi et al. |
| 2020/0204142 A1 | 6/2020 | Choi et al. |
| 2020/0205285 A1 | 6/2020 | Choi et al. |

FOREIGN PATENT DOCUMENTS

| | | | |
|---|---|---|---|
| EP | 2 068 393 A1 | 6/2009 |
| JP | 62271502 A | 11/1987 |
| JP | H 03209905 A | 9/1991 |
| JP | 2005175803 A | 6/2005 |
| JP | 2008004768 A | 1/2008 |
| JP | 2008017243 A | 1/2008 |
| JP | 4539422 B2 | 9/2010 |
| JP | 5152192 B2 | 2/2013 |
| JP | 2018067612 A | 4/2018 |
| KR | 2017000423 8 A | 1/2017 |
| TW | 548669 B | 8/2003 |
| WO | WO 2004/004061 | 1/2004 |

OTHER PUBLICATIONS

International Search Report and Written Opinion for PCT/US2019/067110 dated Apr. 21, 2020, 15 pages.

Xu et al., "Design of Multilayer Dielectric Filter Based on PLC Technology," *Proceedings of 2003 National Microwave and Millimeter Wave Conference, Proceedings of Microwave Branch of Chinese Institute of Electronics*, Nov. 8, 2003, pp. 426-429.

Chinese Search Report for CN Application No. 2019800850933 dated Oct. 11, 2021, 2 pages.

* cited by examiner

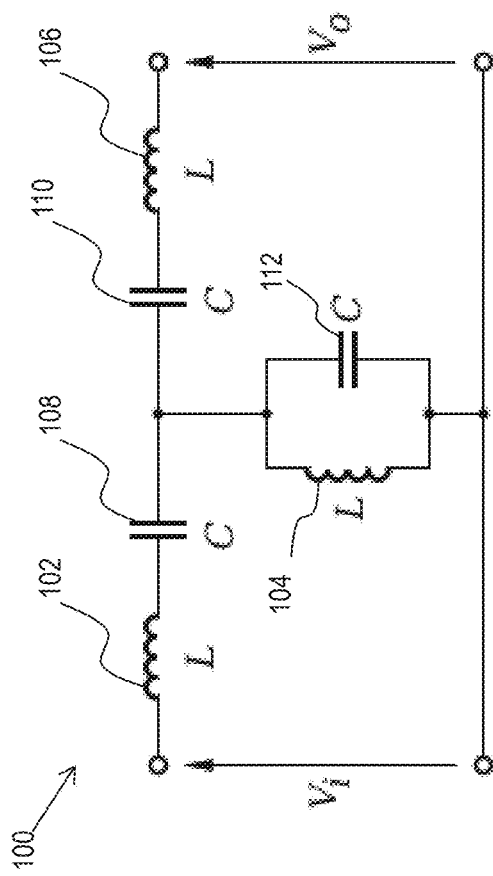
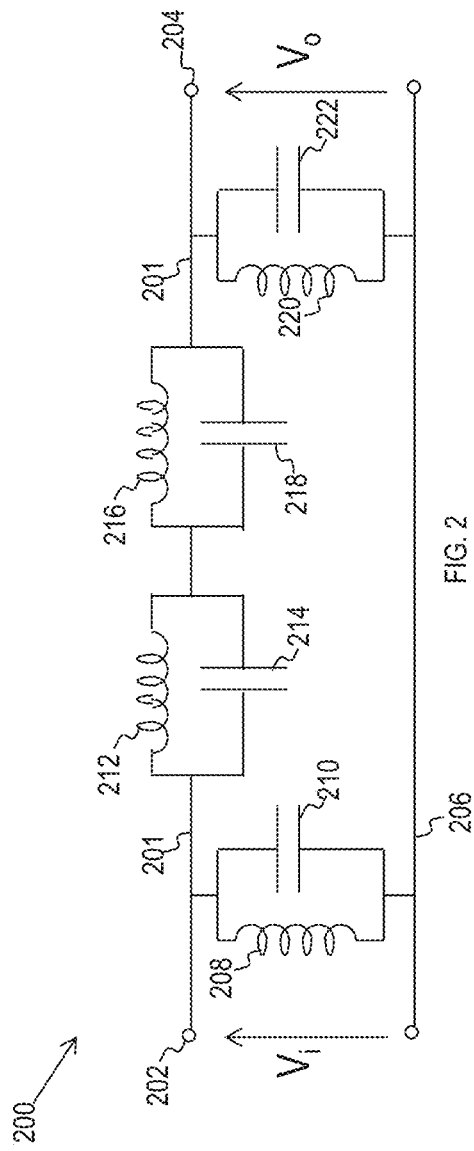
FIG. 1
FIG. 2

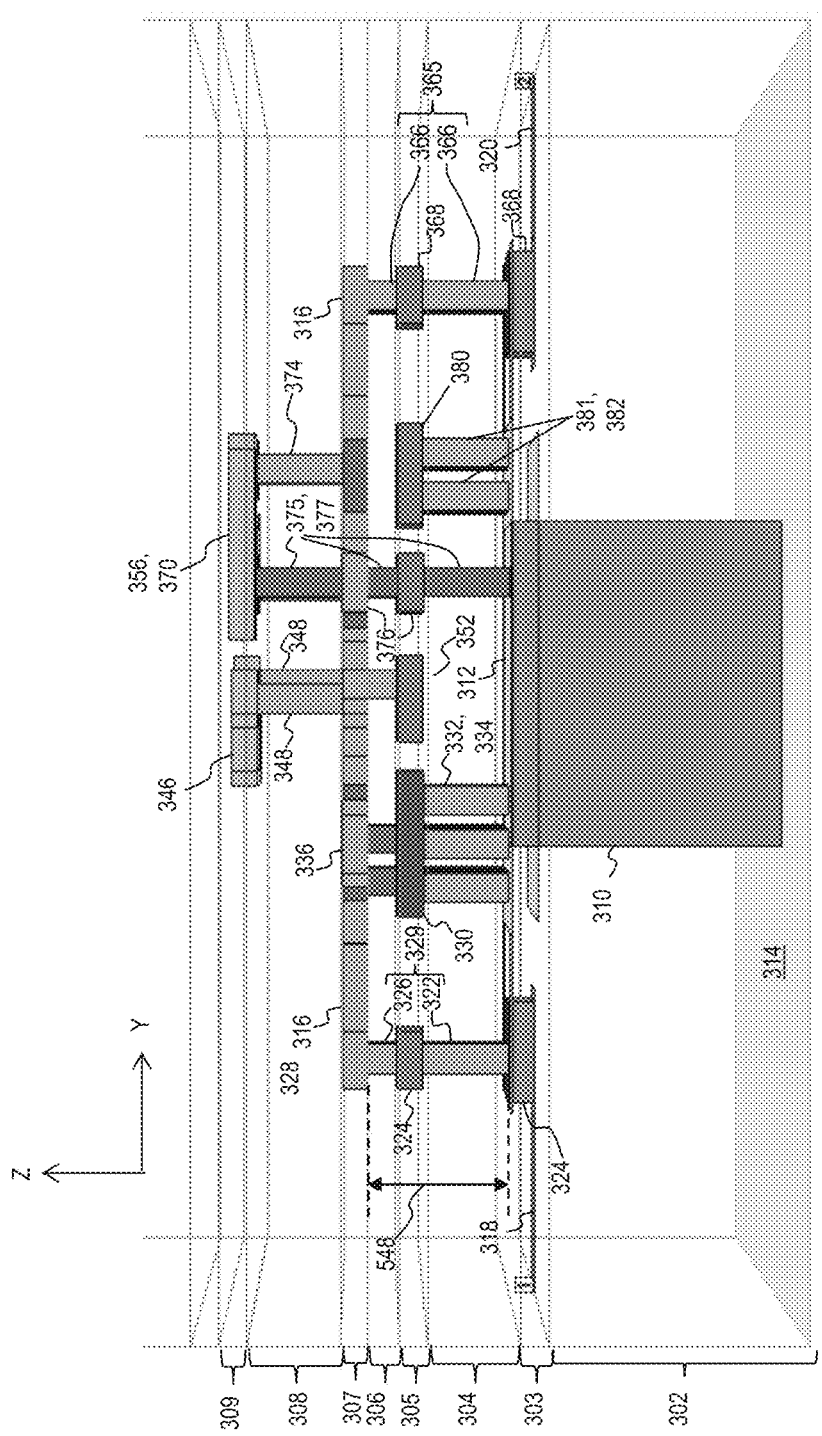

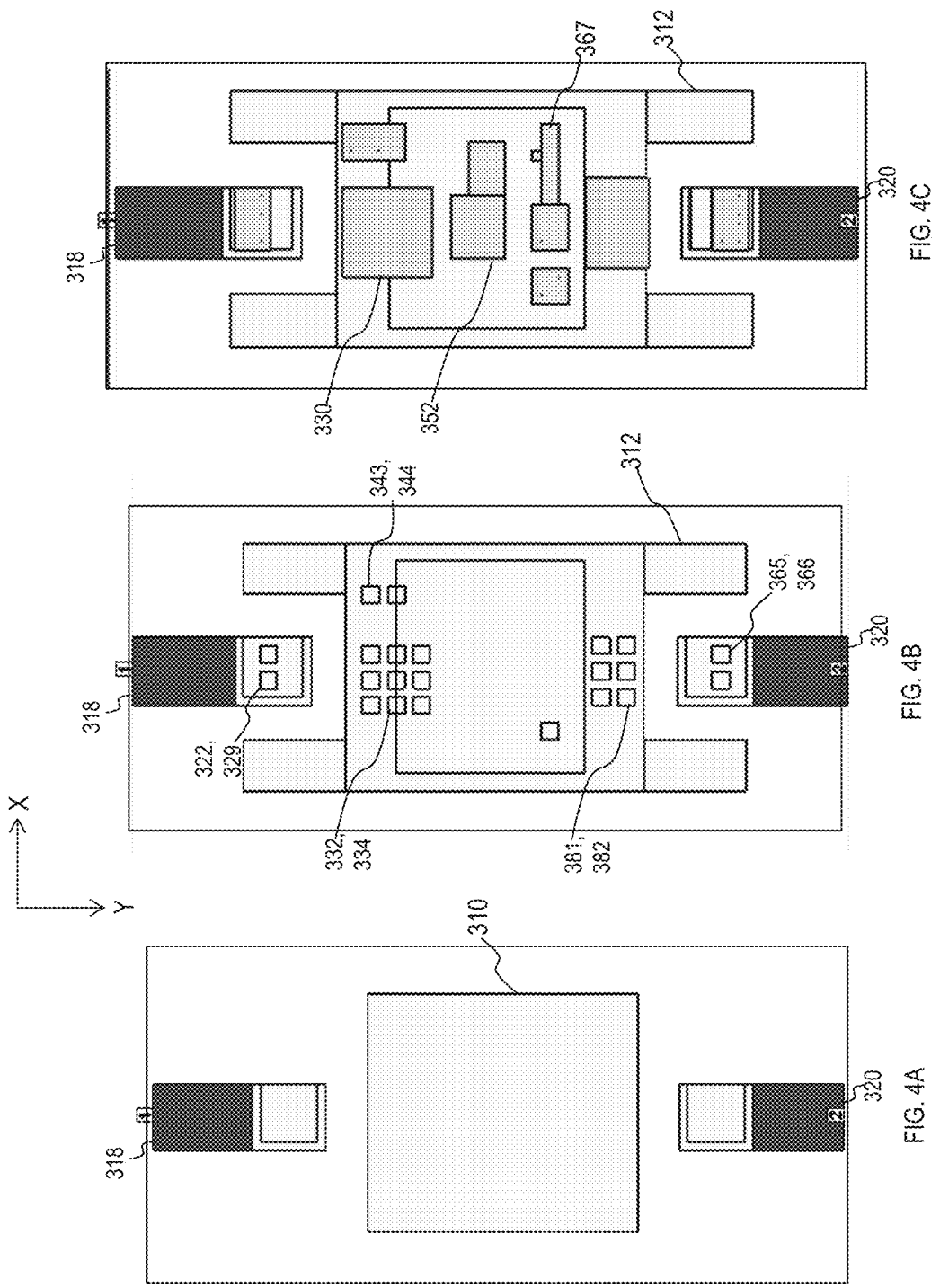

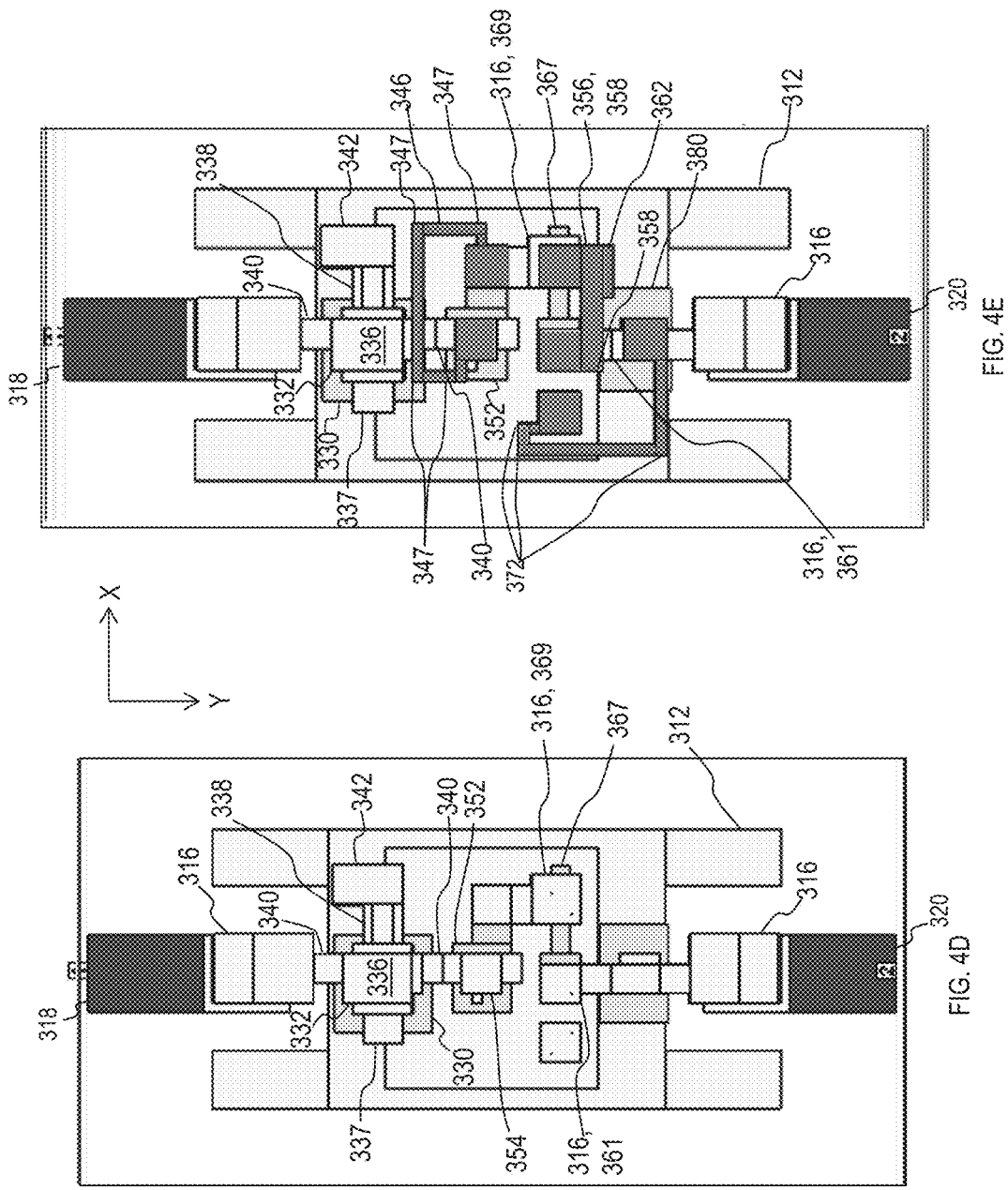

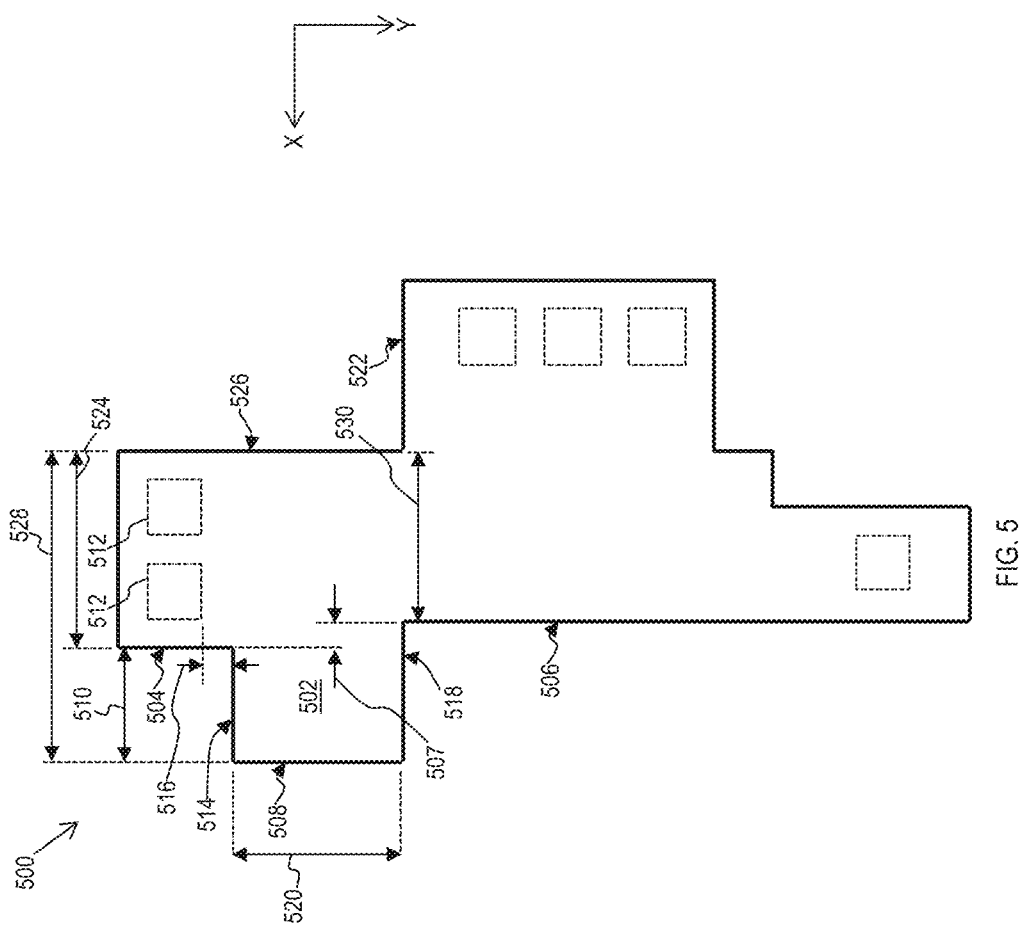

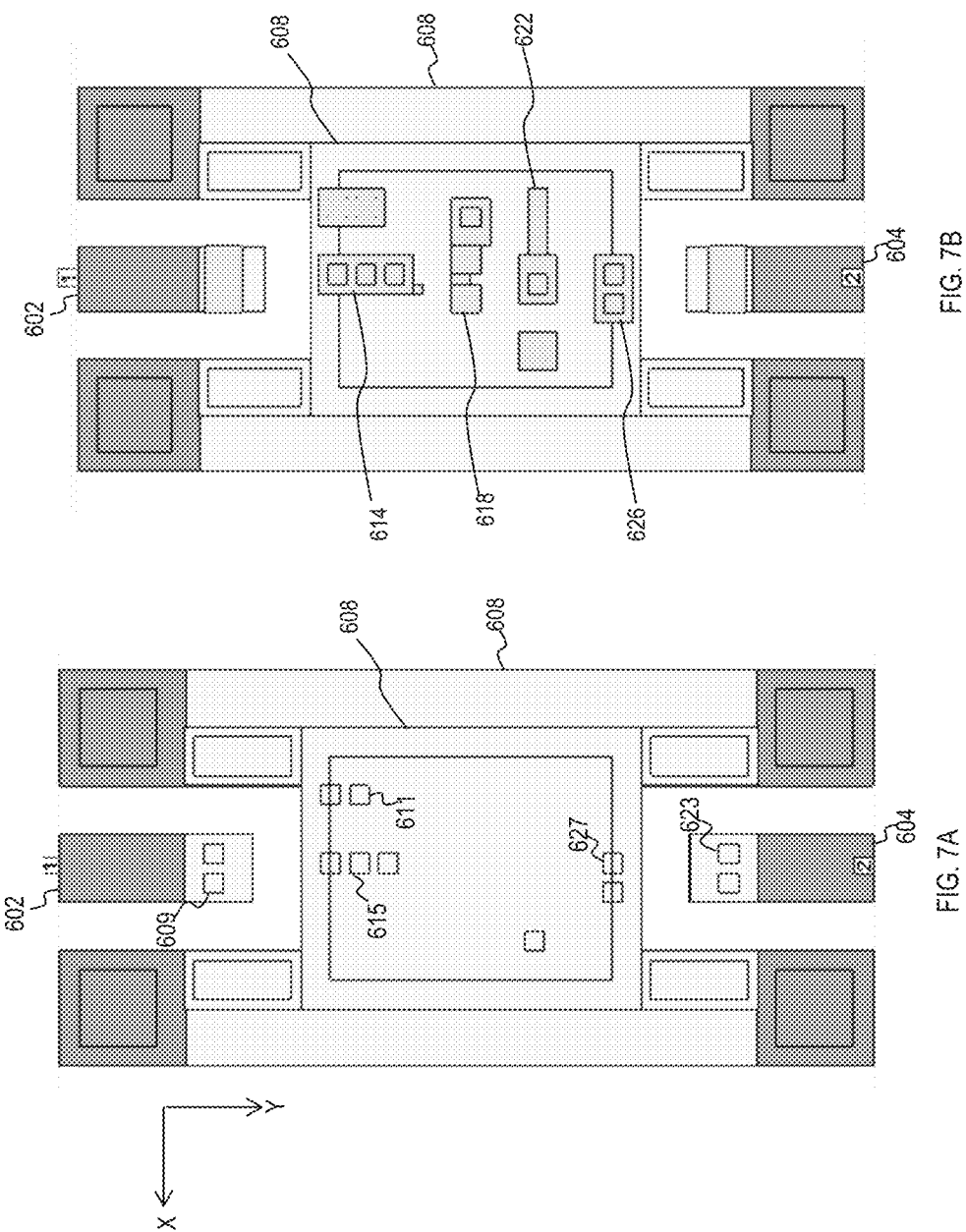

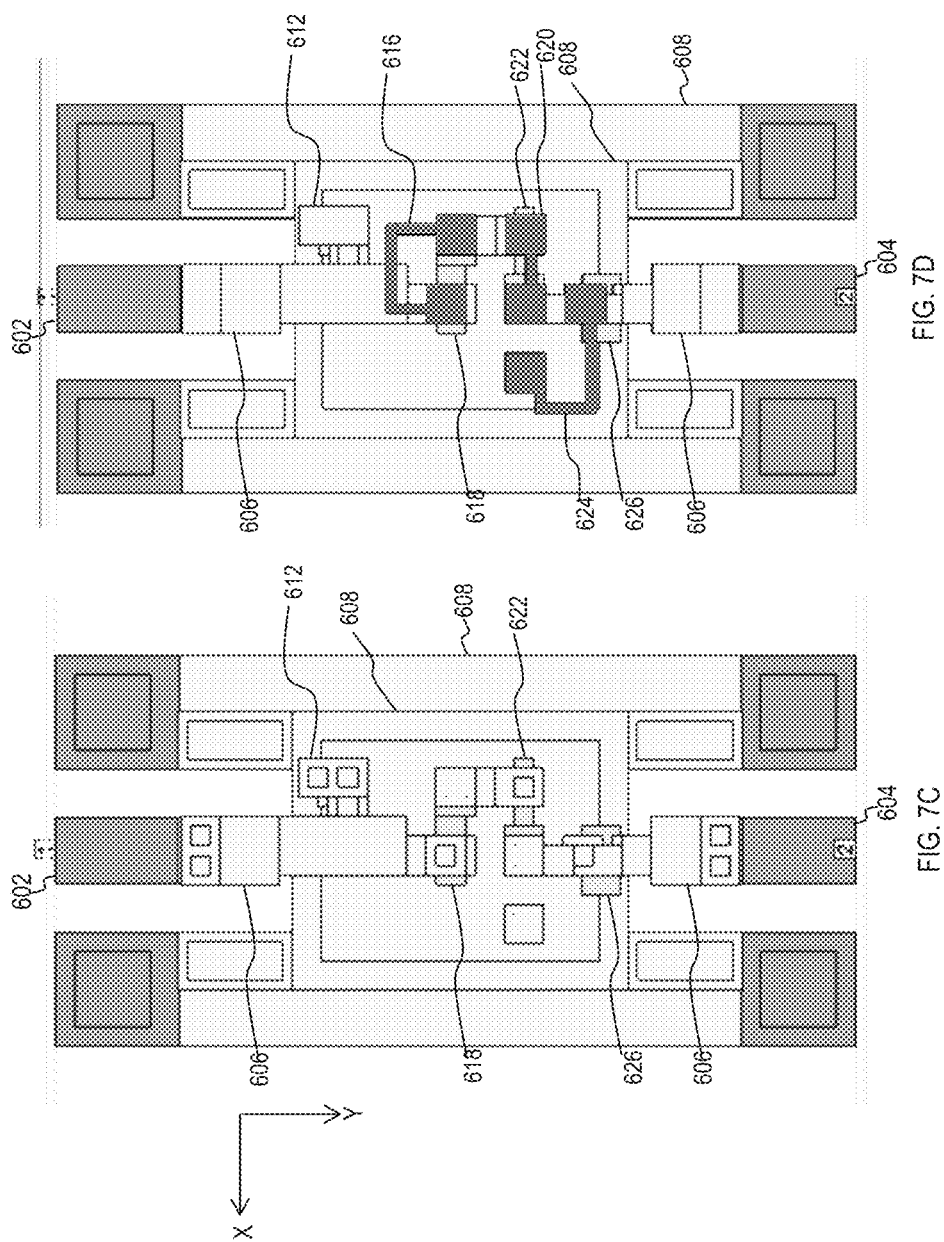

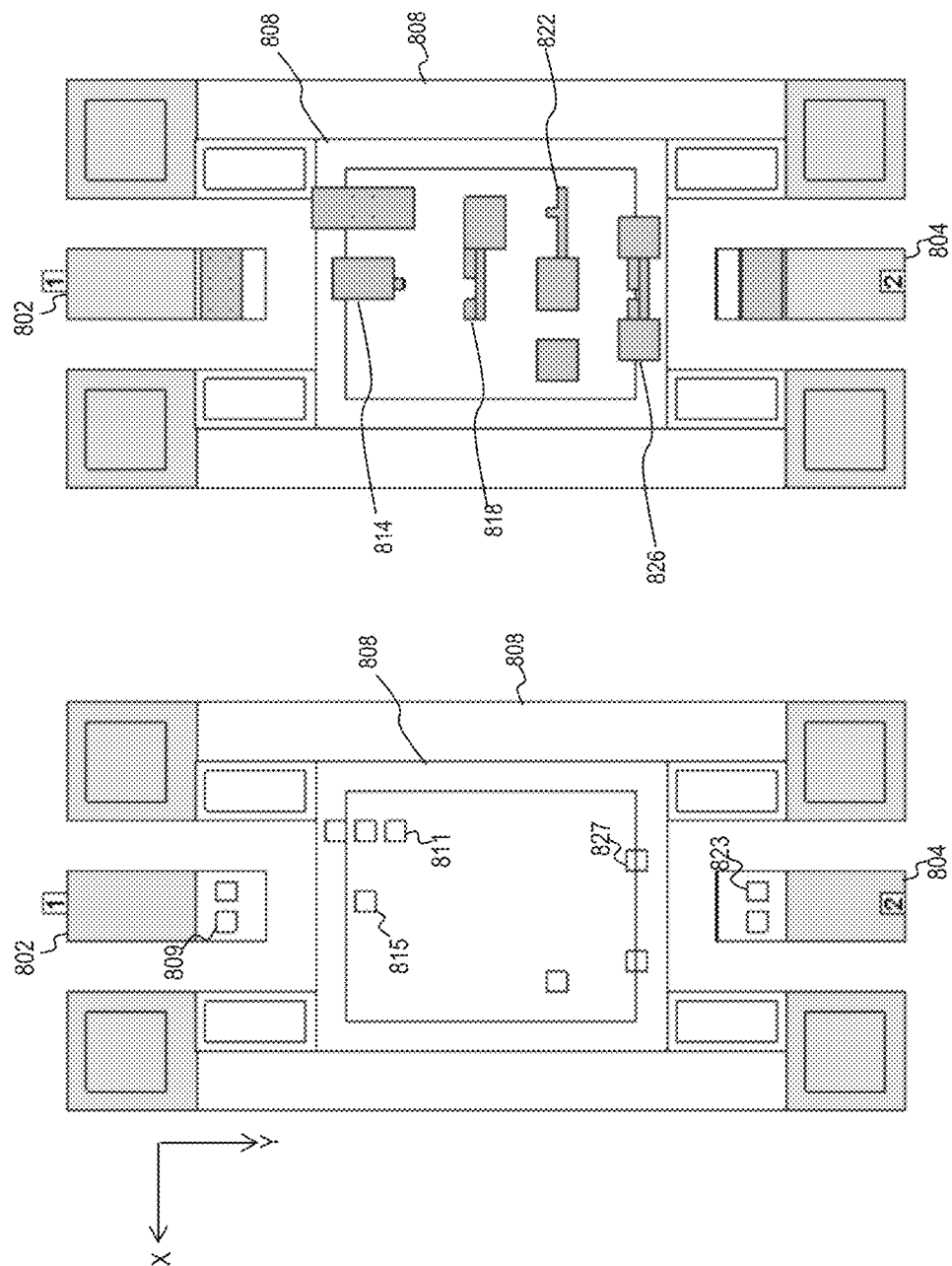

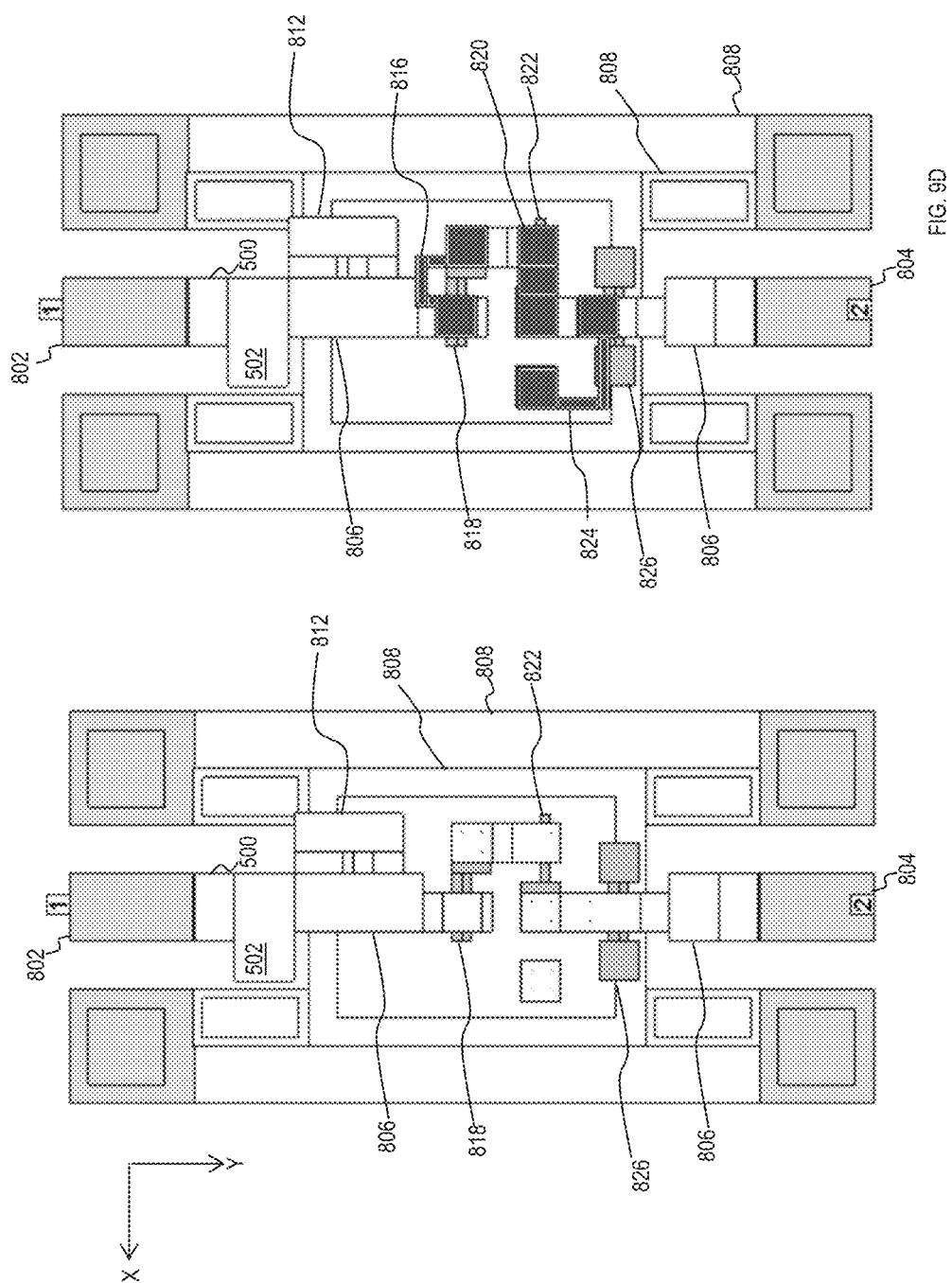

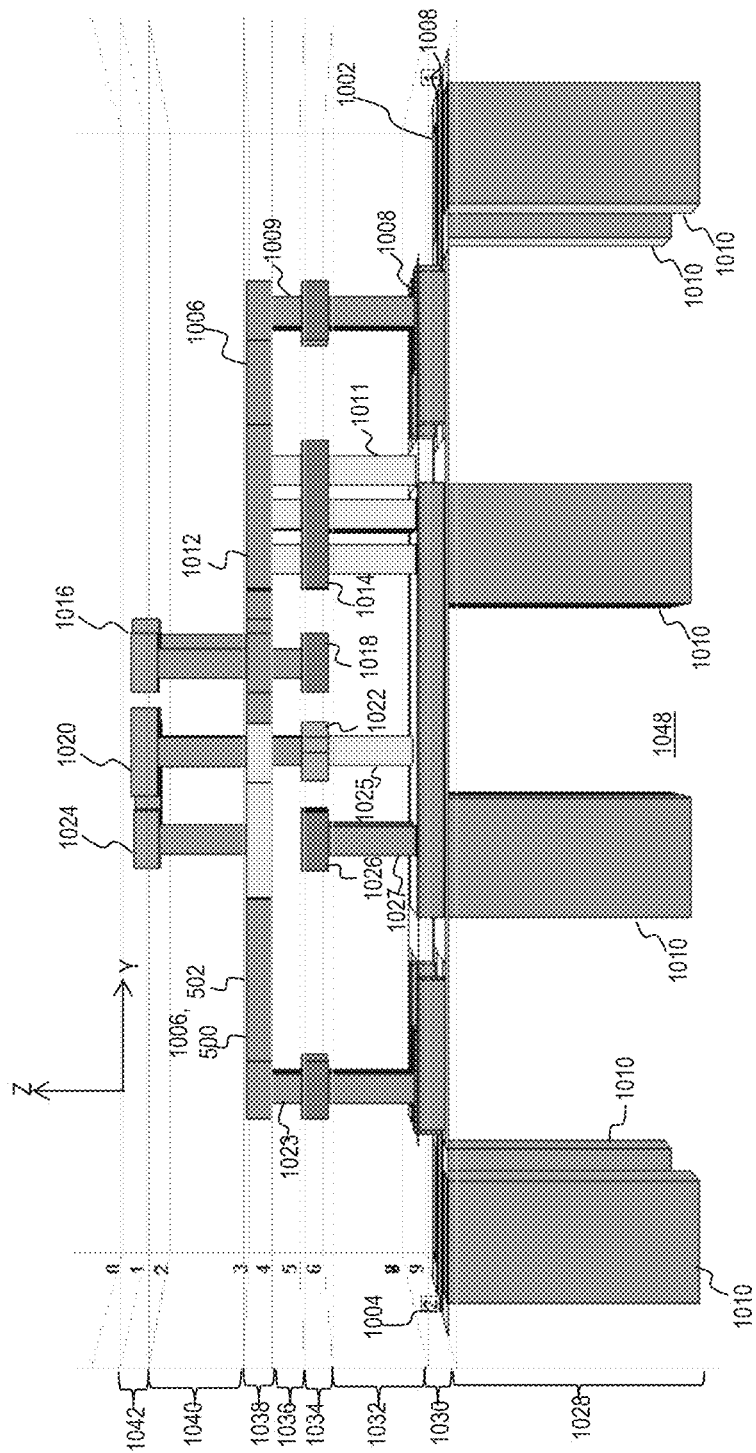

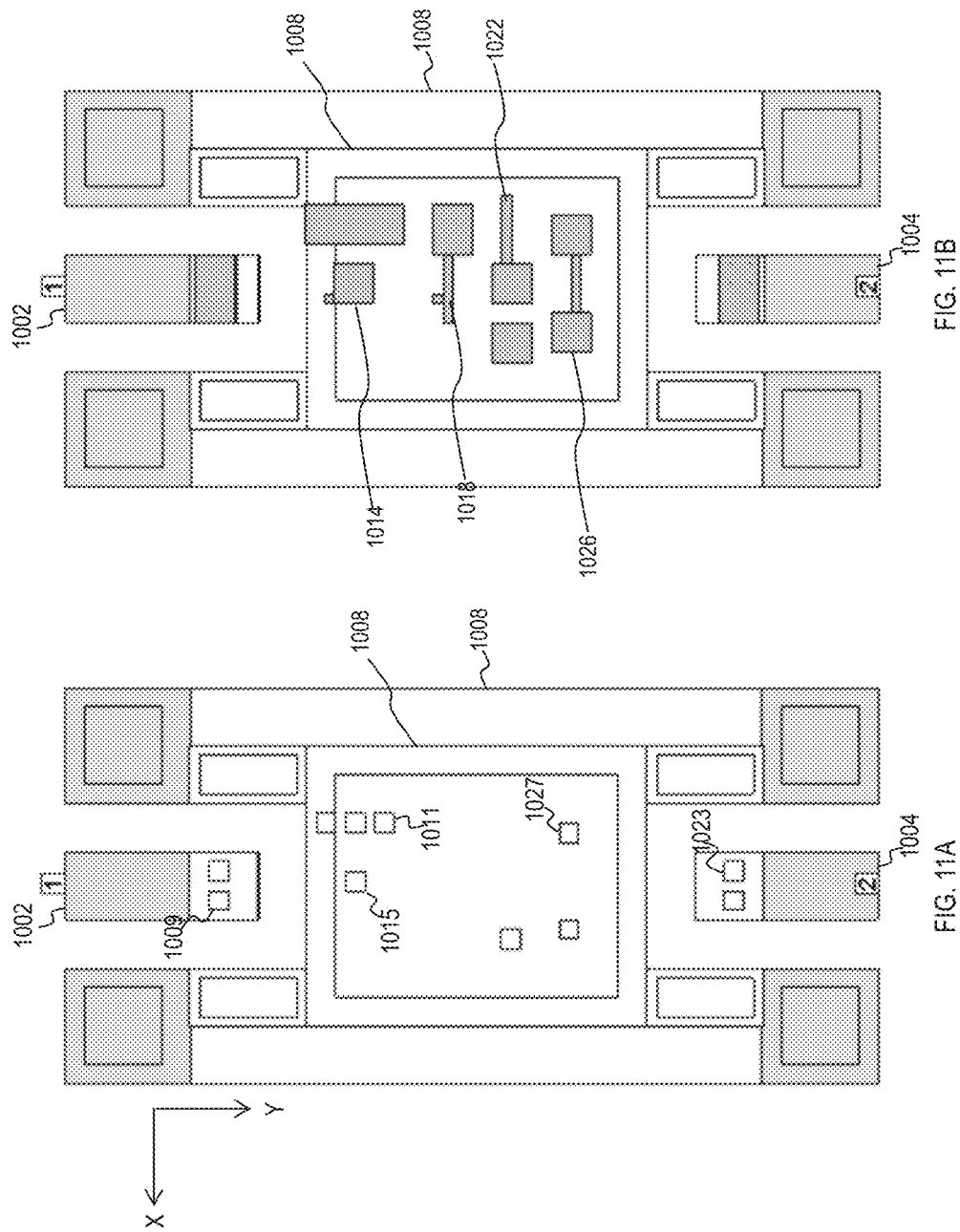

MULTILAYER FILTER INCLUDING A RETURN SIGNAL REDUCING PROTRUSION

CROSS REFERENCE TO RELATED APPLICATION

The present application claims filing benefit of U.S. Provisional Patent Application Ser. No. 62/782,482 having a filing date of Dec. 20, 2018, which is incorporated herein by reference in its entirety.

BACKGROUND OF THE DISCLOSURE

Electric filters perform many functions and are employed in a variety of electrical devices. For example, filtering of high frequency signals, such as high frequency radio signal communication, has recently increased in popularity. The demand for increased data transmission speed for wireless connectivity has driven demand for high frequency components, including those configured to operate at high frequencies, including 5G spectrum frequencies. Current high frequency filters employ waveguide or cavity designs. The performance characteristics of such designs, however, are difficult to tailor or customize.

Return loss is indicative of the portion of an electrical signal that is reflected at the input of a filter. As such, a multilayer filter that exhibits a low return loss in a pass band frequency (e.g., at high frequencies) would be welcomed in the art.

SUMMARY OF THE DISCLOSURE

In accordance with one embodiment of the present disclosure, a multilayer filter may include a plurality of dielectric layers stacked in a Z-direction that may be perpendicular to each of a first direction and a second direction. The first direction may be perpendicular to the second direction. The multilayer filter may include a signal path having an input and an output. The signal path may include a conductive layer overlying at least one of the plurality of dielectric layers. The conductive layer of the signal path may be elongated in the first direction. The conductive layer of the signal path may have a first edge aligned with the first direction and a second edge parallel with the first edge. The conductive layer of the signal path may include a protrusion extending in the second direction and located between the first edge and the second edge in the first direction. The protrusion may have an end edge that is parallel with the first edge and offset from the first edge in the second direction by a protrusion length that is greater than about 50 microns. The multilayer filter may include an inductor including a conductive layer electrically connected at a first location with the signal path and electrically connected at a second location with at least one of the signal path or a ground.

In accordance with another embodiment of the present disclosure, a method of forming a multilayer filter may include forming a signal path that includes a conductive layer overlying a first dielectric layer. The conductive layer of the signal path may be elongated in the first direction. The conductive layer of the signal path may have a first edge aligned with the first direction and a second edge that is parallel with the first edge. The conductive layer of the signal path may include a protrusion extending in the second direction and located between the first edge and the second edge in the first direction. The protrusion may have an end edge that is parallel with the first edge and offset from the first edge in the second direction by a protrusion length that is greater than about 50 microns. The method may include forming an inductor that includes a conductive layer overlying a second dielectric layer. The method may include stacking the first and second dielectric layers such that the inductor is electrically connected at a first location with the signal path and electrically connected at a second location with at least one of the signal path or a ground.

BRIEF DESCRIPTION OF THE DRAWINGS

A full and enabling disclosure of the present disclosure, including the best mode thereof, directed to one of ordinary skill in the art, is set forth more particularly in the remainder of the specification, which makes reference to the appended figures, in which:

FIG. 1 is a simplified schematic of a band pass filter according to aspects of the present disclosure;

FIG. 2 is a simplified schematic of another band pass filter according to aspects of the present disclosure;

FIG. 3C is a side elevation view of the filter of FIGS. 3A and 3B;

FIGS. 4A through 4E are a series of sequential top down views of the filter in which an additional layer is shown in each sequential figure;

FIG. 5 is a top down view of a conductive layer of a signal path that may correspond with the signal path of the multilayer filter of FIGS. 8A through 9D and/or the signal path of the multilayer filter of FIGS. 10A through 11D;

FIGS. 7A through 7D are a series of sequential top down views of the filter of FIGS. 6A and 6B in which an additional layer is shown in each sequential figure;

FIGS. 9A through 9D are a series of sequential top down views of the filter of FIGS. 8A and 8B in which an additional layer is shown in each sequential Figure;

FIG. 10B is a side elevation view of the filter of FIG. 10A;

FIGS. 11A through 11D are a series of sequential top down views of the filter of FIGS. 10A and 10B in which an additional layer is shown in each sequential figure;

Figure 3A:
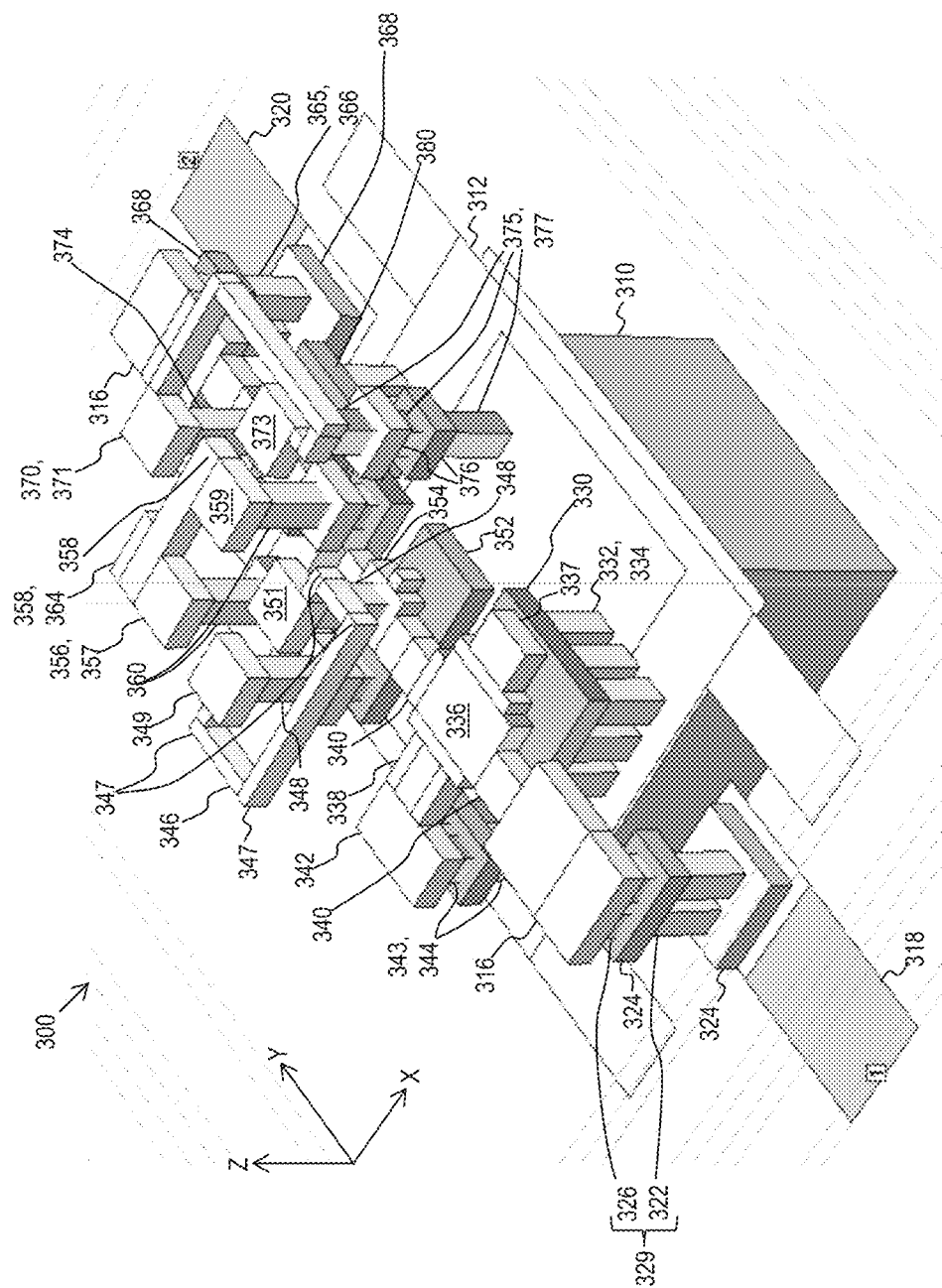
FIGS. 3A and 3B are perspective views of an example band pass filter according to aspects of the present disclosure.

Repeat use of reference characters in the present specification and drawings is intended to represent same or analogous features or elements of the disclosure.

DETAILED DESCRIPTION OF REPRESENTATIVE EMBODIMENTS

It is to be understood by one of ordinary skill in the art that the present discussion is a description of exemplary embodiments only, and is not intended as limiting the broader aspects of the present disclosure, which broader aspects are embodied in the exemplary construction.

Generally speaking, the present disclosure is directed to a multilayer filter including a protrusion that may reduce the return signal of the multilayer filter at a frequency within a pass band of the multilayer filter. The multilayer filter may include a plurality of dielectric layers stacked in a Z-direction that is perpendicular to each of a first direction (e.g., a Y-direction) and a second direction (e.g., a X-direction). The first direction may be perpendicular to the second direction. The signal path may include a conductive layer overlying one of a plurality of dielectric layers. The conductive layer of the signal path may be elongated in a first direction and may include a protrusion extending in the second direction. The protrusion may have a length in the second direction that is greater than about 50 microns.

The protrusion may reduce the return loss of the multilayer filter within a pass band frequency range. For example, the multilayer filter may exhibit a return loss at a frequency within the pass band frequency range that is less than −20 dB. Similarly, in some embodiments, the multilayer filter may be configured as a low pass filter and may exhibit a return loss that is less than −20 dB at a frequency below a cut-off frequency. In some embodiments, the multilayer filter may be configured as a high pass filter and may exhibit a return loss that is less than −20 dB at a frequency above the cut-off frequency.

The multilayer filter may include one or more dielectric materials. In some embodiments, the one or more dielectric materials may have a low dielectric constant. The dielectric constant may be less than about 100, in some embodiments less than about 75, in some embodiments less than about 50, in some embodiments less than about 25, in some embodiments less than about 15, and in some embodiments less than about 5. For example, in some embodiments, the dielectric constant may range from about 1.5 and 100, in some embodiments from about 1.5 to about 75, and in some embodiments from about 2 to about 8. The dielectric constant may be determined in accordance with IPC TM-650 2.5.5.3 at an operating temperature of 25° C. and frequency of 1 MHz. The dielectric loss tangent may range from about 0.001 to about 0.04, in some embodiments from about 0.0015 to about 0.0025.

In some embodiments, the one or more dielectric materials may include organic dielectric materials. Example organic dielectric include polyphenyl ether (PPE) based materials, such as LD621 from Polyclad and N6000 series from Park/Nelco Corporation, liquid crystalline polymer (LCP), such as LCP from Rogers Corporation or W. L. Gore & Associates, Inc., hydrocarbon composites, such as 4000 series from Rogers Corporation, and epoxy-based laminates, such as N4000 series from Park/Nelco Corp. For instance, examples include epoxy based N4000-13, bromine-free material laminated to LCP, organic layers with high K material, unfilled high-K organic layers, Rogers 4350, Rogers 4003 material, and other thermoplastic materials such as polyphenylene sulfide resins, polyethylene terephthalate resins, polybutylene terephthalate resins, polyethylene sulfide resins, polyether ketone resins, polytetrafluoroethylene resins and graft resins, or similar low dielectric constant, low-loss organic material.

In some embodiments, the dielectric material may be a ceramic-filled epoxy. For example, the dielectric material may include an organic compound, such as a polymer (e.g., an epoxy) and may contain particles of a ceramic dielectric material, such as barium titanate, calcium titanate, zinc oxide, alumina with low-fire glass, or other suitable ceramic or glass-bonded materials.

Other materials may be utilized, however, including, N6000, epoxy based N4000-13, bromine-free material laminated to LCP, organic layers with high K material, unfilled high-K organic layers, Rogers 4350, Rogers 4003 material (from the Rogers Corporation), and other thermoplastic materials such as hydrocarbon, Teflon, FR4, epoxy, polyamide, polyimide, and acrylate, polyphenylene sulfide resins, polyethylene terephthalate resins, polybutylene terephthalate resins, polyethylene sulfide resins, polyether ketone reszns, polytetrafluoroethylene resins, BT resin composites (e.g., Speedboard C), thermosets (e.g., Hitachi MCL-LX-67F), and graft resins, or similar low dielectric constant, low-loss organic material.

Additionally, in some embodiments, non-organic dielectric materials may be used including a ceramic, semiconductive, or insulating materials, such as, but not limited to barium titanate, calcium titanate, zinc oxide, alumina with low-fire glass, or other suitable ceramic or glass-bonded materials. Alternatively, the dielectric material may be an organic compound such as an epoxy (with or without ceramic mixed in, with or without fiberglass), popular as circuit board materials, or other plastics common as dielectrics. In these cases, the conductor is usually a copper foil which is chemically etched to provide the patterns. In still further embodiments, dielectric material may comprise a material having a relatively high dielectric constant (K), such as one of NPO (COG), X7R, X5R X7S, Z5U, Y5V and strontium titanate. In such examples, the dielectric material may have a dielectric constant that is greater than 100, for example within a range from between about 100 to about 4000, in some embodiments from about 1000 to about 3000.

In some embodiments, the multilayer filter may include a signal path having an input and an output. The signal path may include one or more conductive layers overlying one or more of the dielectric layers. The conductive layers may include a variety of conductive materials. For example, the conductive layers may include copper, nickel, gold, silver, or other metals or alloys. The conductive layers may be formed directly on the respective dielectric layers. Alternatively, one or more intermediate layers or coating may be arranged between the conductive layers and the respective dielectric layers. As used herein, "formed on" may refer to either a conductive layer that is directly formed on a dielectric layer or a conductive layer that overlies the dielectric layer with an intermediate layer or coating therebetween.

The conductive layers may be formed using a variety of suitable techniques. Subtractive, semi-additive or fully additive processes may be employed with panel or pattern electroplating of the conductive material followed by print and etch steps to define the patterned conductive layers. Photolithography, plating (e.g., electrolytic), sputtering, vacuum deposition, printing, or other techniques may be used to form the conductive layers. For example, a thin layer (e.g., a foil) of a conductive material may be adhered (e.g., laminated) to a surface of a dielectric layer. The thin layer of conductive material may be selectively etched using a mask and photolithography to produce a desired pattern of the conductive material on the surface of the dielectric material.

In some embodiments, the multilayer filter may include one or more vias formed in one or more of the dielectric layers. For example, a via may electrically connect a conductive layer on one dielectric layer with a conductive layer on another dielectric layer. The via may include a variety of conductive materials, such as copper, nickel, gold, silver, or other metals or alloys. The vias may be formed by drilling (e.g., mechanical drilling, laser drilling, etc.) through holes and plating the through holes with a conductive material, for example using electroless plating or seeded copper. The vias may be filled with conductive material such that a solid column of conductive material is formed. Alternatively, the interior surfaces of the through holes may be plated such that the vias are hollow. The vias may have lengths in the Z-direction that are less than about 180 microns, in some embodiments less than about 100 microns, and in some embodiments less than about 80 microns.

In some embodiments, at least some of the dielectric layers may have thicknesses that are less than about 180 microns, in some embodiments less than about 120 microns, in some embodiments less than about 100 microns in some embodiments less than about 80 microns, in some embodiments less than about 60 microns, in some embodiments less than about 50 microns, in some embodiments less than about 40 microns, in some embodiments less than about 30 microns, and in some embodiments less than about 20 microns.

The multilayer filter may exhibit excellent performance characteristics, such as low insertion loss for frequencies within a pass band frequency range of the multilayer filter. The pass band frequency range may be defined as a continuous frequency range within which the multilayer filter exhibits greater than about −5 dB insertion loss, in some embodiments greater than about −3 dB, and in some embodiments greater than about −2 dB.

Additionally, the multilayer filter may exhibit steep roll-off from the passband frequency range to frequencies outside the passband. For example, for frequencies immediately outside the passband frequency range, the insertion loss may decrease at a rate of about 0.1 dB/MHz, in some embodiments greater than about 0.2 dB/MHz, in some embodiments greater than about 0.3 dB/MHz, and in some embodiments greater than about 0.4 dB/MHz.

The multilayer filter may also exhibit consistent performance characteristics (e.g., insertion loss, return loss, etc.) across a wide range of temperatures. In some embodiments, the insertion loss of the multilayer filter may vary less than 5 dB or less across large temperature ranges. For example, the multilayer filter can exhibit a first insertion loss at about 25° C. and at a first frequency. The multilayer filter can exhibit a second insertion loss at a second temperature and at about the first frequency. A temperature difference between the first temperature and the second temperature can be about 70° C. or greater, in some embodiments about 60° C. or greater, in some embodiments about 50° C. or greater, in some embodiments about 30° C. or greater, and in some embodiments about 20° C. or greater. As an example, the first temperature can be 25° C., and the second temperature can be 85° C. As another example, the first temperature can be 25° C., and the second temperature can be −55° C. The difference between the second insertion loss and the first insertion loss can be about 5 dB or less, in some embodiments about 2 dB or less, in some embodiments about 1 dB or less, in some embodiments, about 0.75 dB or less, in some embodiments about 0.5 dB or less, and in some embodiments, about 0.2 dB or less.

In some embodiments, the multilayer filter may have an overall length that ranges from about 0.5 mm to about 30 mm, in some embodiments, from about 1 mm to about 15 mm, and in some embodiments from about 2 mm to about 8 mm.

In some embodiments, the multilayer filter may have an overall width that ranges from about 0.2 mm to about 20 mm, in some embodiments from about 0.5 mm to about 15 mm, in some embodiments from about 1 mm to about 10 mm, and in some embodiments from about 2 mm to about 8 mm.

The multilayer filter may generally be low-profile or thin. For example, in some embodiments, the multilayer filter may have an overall thickness that ranges from about 100 microns to about 2 mm, in some embodiments from about 150 microns to about 1 mm, and in some embodiments from about 200 microns to about 300 microns.

Regardless of the particular configuration employed, the present inventors have discovered that through selective control over the shape and arrangement of a signal path protrusion, a multilayer filter can be achieved that exhibits low return loss at select frequencies (e.g., within a pass band frequency range).

More specifically, the signal path may include a conductive layer that is elongated in a first direction (e.g., the Y-direction). The protrusion may extend from the signal path in a second direction (e.g., the X-direction) that is perpendicular to the first direction. The conductive layer of the signal path may have a first edge and a second edge. Each of the first edge and second edge may be parallel with the first direction. The protrusion may be located between the first edge and the second edge in the first direction. The protrusion may have an end edge that is parallel with the first edge and that is offset from the first edge in the second direction by a protrusion length. The protrusion length may range from about 50 microns to about 1200 microns, in some embodiments from about 100 microns to about 800 microns, in some embodiments from about 150 microns to about 400 microns, e.g., about 200 microns.

The first edge may be spaced apart from the second edge by a relatively small distance. For example, a distance may be defined in the second direction (e.g., the X-direction) between the first edge and the second edge. In some embodiments, the distance may be less than 200 microns, in some embodiments less than about 150 microns, in some embodiments less than about 100 microns, in some embodiments less than about 50 microns, in some embodiments less than about 20 microns, in some embodiments less than about 10 microns.

The protrusion may be located relatively close to one or more electrical connections with an input. The electrical connections may include vias or other suitable vertical electrical connections (e.g., castellations, external plating, etc.) More specifically, the protrusion may have a first side edge that is parallel with the second direction (e.g., X-direction). The first side edge may extend between the end edge and the first edge. A distance may be defined in the first direction (e.g., the Y-direction) between the first side edge and the electrical connections. In some embodiments, the distance may be less than about 500 microns, in some embodiments less than about 400 microns, in some embodiments less than about 300 microns, in some embodiments less than about 200 microns, in some embodiments less than about 100 microns, e.g., about 50 microns.

The protrusion may have a width in a direction that is perpendicular to the protrusion length. For example, the protrusion may have a second side edge that is parallel with the second direction (e.g., X-direction). The second side edge may also be parallel with the first side edge. The second side edge may extend (e.g., connect) between the end edge and the second edge. The second side edge may be spaced apart from the first side edge by a protrusion width. In some embodiments, the protrusion width may range from about 50 microns to about 1200 microns, in some embodiments from about 100 microns to about 800 microns, in some embodiments from about 150 microns to about 400 microns, e.g., about 300 microns.

A length-to-width ratio may be defined as a ratio of the protrusion length to the protrusion width. The length-to-width ratio may range from about 0.2 to about 2, in some embodiments from about 0.3 to about 1.8, in some embodiments from about 0.4 to about 1.5, and in some embodiments from about 0.5 to about 1.2.

The second edge of the protrusion may be approximately aligned with an edge of a first inductor. The edge of the first inductor may be aligned with the second direction (e.g., X-direction). A distance in the first direction (e.g., Y-direction) may be defined between the second edge of the protrusion and the first inductor. The distance may be less than about 200 microns, in some embodiments less than about 100 microns, in some embodiments less than about 50 microns, in some embodiments less than about 20 microns, and in some embodiments less than about 10 microns.

The signal path may have a first width in the second direction (e.g., the X-direction) between first edge and a third edge. The third edge may be parallel with the first edge. The first width may range from about 100 microns to about 1200 microns, in some embodiments from about 200 microns to about 800 microns, in some embodiments from about 300 microns to about 400 microns, e.g., about 350 microns.

The signal path may have a second width in the second direction (e.g., the X-direction). The second width may be defined between the end edge and the third edge. The second width may range from about 200 microns to about 1400 microns, in some embodiments from about 300 microns to about 1000 microns, in some embodiments from about 400 microns to about 800 microns, e.g., about 600 microns.

The signal path may have a third width in the second direction (e.g., the X-direction). The third width may be defined between the second edge and the third edge. The third width may range from about 100 microns to about 1200 microns, in some embodiments from about 200 microns to about 800 microns, in some embodiments from about 300 microns to about 400 microns, e.g., about 300 microns.

A second-to-first width ratio may be defined as a ratio of the second width to the first width of the conductive layer of the signal path. The second-to-first width ratio range from about 1.05 to about 3, in some embodiments from about 1.1 to about 2.5, in some embodiments from about 1.2 to about 2.2, in some embodiments from about 1.3 to about 2, and in some embodiments from about 1.5 to about 1.7.

The protrusion may be spaced apart in the Z-direction from other conductive layers by at least about 30 microns, in some embodiments at least about 50 microns, in some embodiments at least about 100 microns, in some embodiments at least about 150 microns, in some embodiments at least about 200 microns, in some embodiments at least about 300 microns.

In some embodiments, the multilayer filter may be configured as a band pass filter and may have a pass band frequency range. The multilayer filter may exhibit a return loss at a frequency within the pass band frequency range that is less than −15 dB, in some embodiments less than −20 dB, in some embodiments less than −25 dB, in some embodiments less than about −30 dB, in some embodiments less than about −35 dB, and in some embodiments less than about −40 dB.

For example, the multilayer filter may exhibit return loss values that are less than −10 dB across some or all frequencies within the pass band frequency range. For example, the first frequency range may be defined between a first frequency and a second frequency, and each of the first frequency and second frequency may fall within the pass band frequency range. A difference between the second frequency and first frequency of the first frequency range may be about 5 GHz or more, in some embodiments about 4 GHz or more, in some embodiments about 2 GHz or more, and in some embodiments about 1 GHz or more.

For example, the multilayer filter may exhibit return loss values that are less than −15 dB across some or all frequencies within the pass band frequency range. For example, the second frequency range may be defined between a first frequency and a second frequency, and each of the first frequency and second frequency may fall within pass band frequency range. A difference between the second frequency and first frequency of the second frequency range may be 3 GHz or more, in some embodiments 2 GHz or more, and in some embodiments 1 GHz or more.

In some embodiments, the multilayer filter may exhibit return loss values that are less than −20 dB across such a third range of frequencies falling within the pass band frequency range. For example, the third frequency range may be defined between a first frequency and a second frequency. A difference between the second frequency and the first frequency of the third frequency range may be 1,400 MHz or more, in some embodiments 1,000 MHz or more, and in some embodiments 800 MHz or more, and in some embodiments 400 MHz or more.

In some embodiments, the multilayer filter may exhibit return loss values that are less than −30 dB across a fourth frequency range falling within the pass band frequency range. The fourth range may be defined between a first frequency and a second frequency, and each of the first frequency and second frequency may fall within pass band frequency range. A difference between the second frequency and first frequency of the fourth frequency range may be 200 MHz or more, and in some embodiments 100 MHz or more.

In some embodiments, the multilayer filter may be configured for operation at high frequencies. The multilayer filter may have a characteristic frequency (e.g., a low pass frequency, a high pass frequency, an upper bound of a bandpass frequency, or a lower bound of the bandpass frequency) that is greater than 6 GHz. In some embodiments, the filter may have a characteristic frequency that is greater than about 6 GHz, in some embodiments greater than about 10 GHz, in some embodiments greater than about 15 GHz, in some embodiments greater than about 20 GHz, in some embodiments greater than about 25 GHz, in some embodiments greater than about 30 GHz, in some embodiments greater than about 35 GHz, in some embodiments greater than about 40 GHz, in some embodiments greater than about 45 GHz, in some embodiments greater than about 50 GHz, in some embodiments greater than about 60 GHz, in some embodiments greater than about 70 GHz, and in some embodiments greater than about 80 GHz.

For example, in some embodiments a pass band frequency range of the multilayer filter may have a lower bound that is greater than about 6 GHz, in some embodiments greater than 10 GHz, in some embodiments greater than 20 GHz, in some embodiments greater than 30 GHz, in some embodiments greater than 40 GHz, in some embodiments greater than 50 GHz, in some embodiments greater than about 60 GHz, in some embodiments greater than about 70 GHz, and in some embodiments greater than about 80 GHz.

I. Multilayer Filter

FIG. 1 is a simplified schematic of a multilayer filter 100 according to aspects of the present disclosure. The filter 100 may include one or more inductors 102, 104, 106, and one or more capacitors 108, 110, 112. An input voltage (represented by $V_i$ in FIG. 1) may be input to the filter 100, and an output voltage (represented by $V_o$ in FIG. 1) may be output by the filter 100. The band pass filter 100 may significantly reduce low and high frequencies while allowing frequencies within a passband frequency range to be transmitted through the filter 100 substantially unaffected. It should be understood that the simplified filter 100 described above is merely a simplified example of a band pass filter and that aspects of the present disclosure may be applied to more complex band pass filters. Additionally, aspects of the present disclosure may be applied to other types of filters, including, for example, a low-pass filter or a high-pass filter.

FIG. 2 is a schematic of an example embodiment of a band pass filter 200 according to aspects of the present disclosure. A signal path 201 may be defined between an input 202 and an output 204 of the filter 200. An input voltage (represented by $V_i$ in FIG. 1) may be input to the filter 200 between the input 202 and a ground 206 of the filter 200. An output voltage (represented by $V_o$ in FIG. 1) may be output by the filter 200 between the output 204 and the ground 206.

The filter 200 may include a first inductor 208 and a first capacitor 210 electrically connected in parallel with each other. The first inductor 208 and first capacitor 210 may be electrically connected between the signal path 201 and the ground 206. The filter 200 may include a second inductor 212 and second capacitor 214 electrically connected in parallel with each other. The second inductor 212 and second capacitor 214 may be connected in series with the signal path 201 (e.g., may form a portion of the signal path 201). The filter 200 may include a third inductor 216 and third capacitor 218 electrically connected in parallel with each other. The third inductor 216 and third capacitor 218 may be connected in series with the signal path 201 (e.g., may form a portion of the signal path 201). The filter 200 may include a fourth inductor 220 and fourth capacitor 222 electrically connected in parallel with each other. The fourth inductor 220 and fourth capacitor 222 may be electrically connected between the signal path 201 and the ground 206.

The inductance values of the inductors 208, 212, 216, 220 and the capacitance values of the capacitors 210, 214, 218, 222 may be selected to produce the desired pass band frequency range of the band pass filter 200. The band pass filter 200 may significantly reduce frequencies outside of the passband frequency range while allowing frequencies within a passband frequency range to be transmitted through the filter 200 substantially unaffected.

Figure 3B:
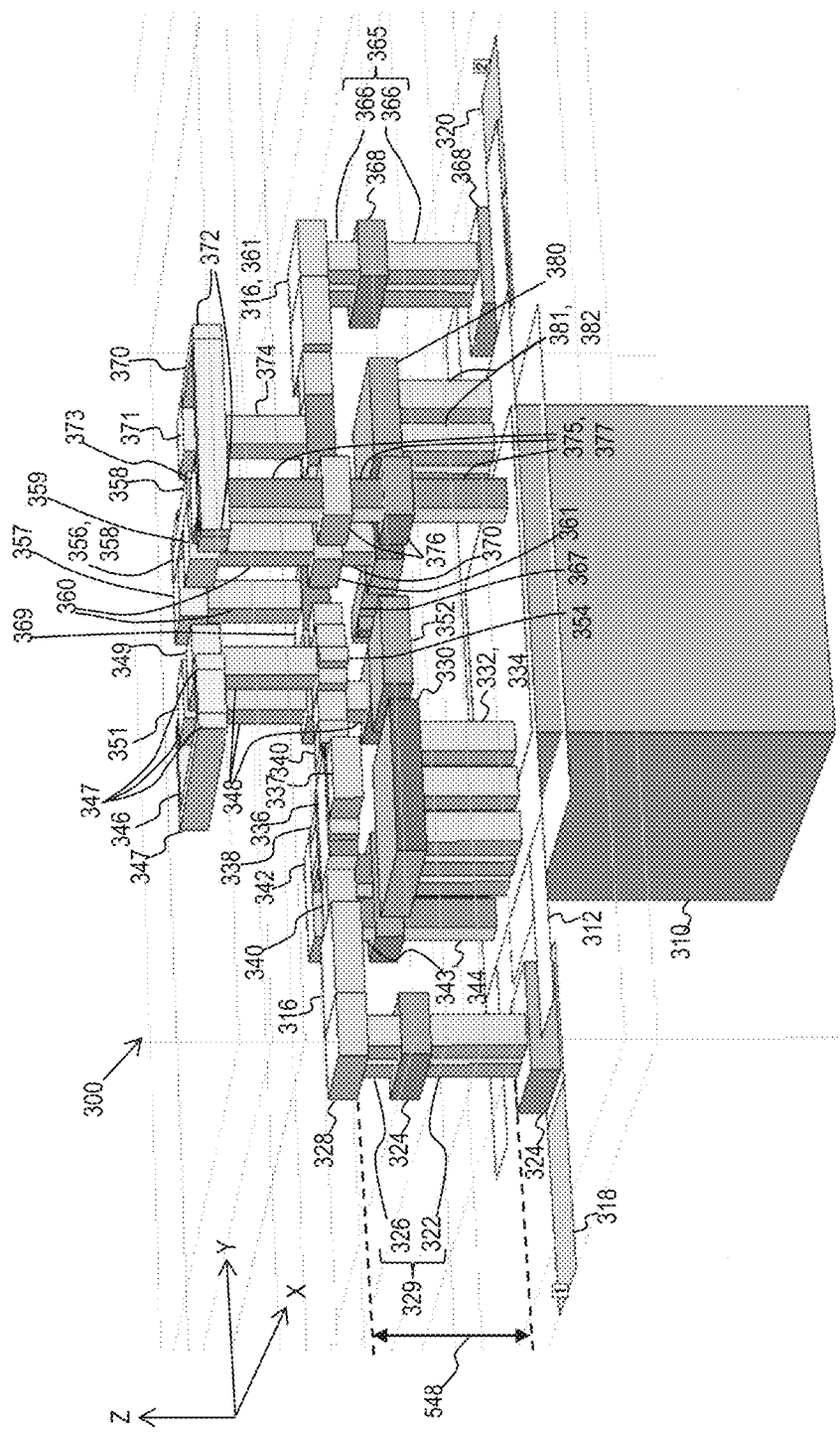

FIGS. 3A and 3B are perspective views of an example band pass filter 300 according to aspects of the present disclosure. FIG. 3C is a side elevation view of the filter 300 of FIGS. 3A and 3B. Referring to FIGS. 3A through 3C, the band pass filter 300 may include a plurality of dielectric layers (transparent for clarity). Referring to FIG. 3C, a first dielectric layer 304, second dielectric layer 306, and third dielectric layer 308 may be stacked to form a monolithic structure. The filter 300 may be mounted to a mounting surface 302, such as a printed circuit board. Conductive layers 303, 305, 307, 309 may be formed on the dielectric layers 304, 306, 308. Conductive layer 303 may be formed on a bottom surface of the first dielectric layer 304. Conductive layers 305, 307 may be formed on a top surface and a bottom surface, respectively of the second dielectric layer 306. A ground may include a ground plane 312 that is exposed and/or terminated along a bottom surface of the filter 300 (the bottom surface of conductive layer 303). The mounting surface may include one or more terminals 310 for connection with the ground plane 312.

FIGS. 4A through 4E are a series of sequential top down views of the filter 300 in which an additional layer is shown in each Figure. More specifically, FIG. 4A illustrates the mounting surface 302 and the first conductive layer 303. FIG. 4B illustrates the ground plane 312 formed on the bottom surface of the first dielectric layer 304. FIG. 4C additionally illustrates the conductive layer 305 formed on the top surface of the first dielectric layer 304. FIG. 4D additionally illustrates conductive layer 307 that is formed on the second dielectric layer 306. FIG. 4E illustrates the conductive layer 309 formed on the third layer 308. The dielectric layers 304, 306, 308 are transparent to show the relative relocations of the various patterned conductive layers 303, 305, 307, 309.

The band pass filter 300 may include a signal path 316 having an input 318 and an output 320. The signal path 316 may electrically connect the input 318 and the output 320. More specifically, the signal path 316 may include a plurality of dielectric layers and/or vias formed in and on the plurality of dielectric layers 304, 306, 308 and electrically connected between the input 318 and the output 320. The signal path 316 may include one or more vias 322 electrically connecting the input 318 with an intermediary conductive layer 324 disposed between the first layer 304 and second layer 306. The signal path 316 may include one or more vias 326 electrically connecting the intermediary layer 324 with a conductive layer 328 formed on the second dielectric layer 306.

A first capacitor may be formed between a portion 336 of the signal path 316 formed on an upper surface of the second layer 306 and a conductive layer 330 formed on a lower surface of the second layer 306 of dielectric material. The conductive layer 330 may be electrically connected with the ground plane 312. The first capacitor of the filter 300 may correspond with the first capacitor 210 of the circuit diagram 200 of FIG. 2. The conductive layer 330 may be capacitively coupled with a portion 336 of the signal path 316. The conductive layer 330 may be spaced apart from the portion 336 of the signal path 316 in a Z-direction. The conductive layer 330 may be electrically connected with the ground plane 312 by one or more vias 334. The first capacitor may be self-aligning.

The first capacitor may be insensitive to relative misalignment of the electrodes of the first capacitor, which may be described as being "self-aligning." The first inductor 342 of the filter 300 may correspond with the first inductor 208 of the circuit diagram 200 of FIG. 2. The first inductor 342 may be connected with the portion 336 of the signal path 316 that forms the first capacitor by a connector portion 338. The first inductor 342 may be electrically connected with the ground plane 312 by one or more vias 344 (best seen in FIG. 3B).

The signal path 316 of the filter 300 may include a second inductor 346, which may correspond with the second inductor 212 of the circuit diagram 200 of FIG. 2. The second inductor 346 may be formed on the third layer 308 (best seen in FIG. 3C). The second inductor 346 may be electrically connected at each of a first location 349 and a second location 351 with the signal path 316. In other words, the second inductor 346 may form a portion of the signal path 316 between the input 318 and the output 320.

One or more vias 348 may connect the second inductor 346 at the first location 349 with a portion 354 of the signal path 316 on the second layer 306 (best seen in FIGS. 3B, 4D, and 4E). One or more vias 348 may connect the second inductive element 346 at the second location 351 with each of a portion 369 of the signal path 316 on the top surface of the second layer 306 and with a conductive layer 352 on the bottom surface of the second layer 306 (which forms a second capacitor with the portion 354 of the signal path 316, described below). As best seen in FIGS. 3A and 4E, the inductor 346 may have four corners. As such, the second inductor 346 may form greater than half of a "loop."

The second capacitor may be formed between the conductive layer 352 and the portion 354 of the signal path 316. The second capacitor may correspond with the second capacitor 214 of the circuit diagram 200 of FIG. 2. The second capacitor may be a self-aligning capacitor.

The third inductor 356 of the filter 300 may correspond with the third inductor 216 of the circuit diagram 200 of FIG. 2. The third inductor 356 may be connected by one or more vias 360 at a first location 357 with the portion 369 of the signal path 316 that is connected with the second inductor 346. The third inductor 356 may be connected by one or more vias 360 at a second location 359 with the portion 361 of the signal path 316 that is connected with the output 320. The portion 361 of the signal path 316 may be electrically connected with the output 320 by one or more vias 366 and/or intermediary layers 368. In other words, the third inductor 356 may form a portion of the signal path 316 between the second inductor 346 and the output 320.

A third capacitor may be formed in parallel with third inductor 356. The third capacitor may correspond with the third capacitor 218 of the circuit diagram 200 of FIG. 2. The third capacitor of the filter 300 may include a conductive layer 367 that is capacitively coupled with the portion 369 of the signal path 316.

A fourth inductor 370 may be electrically connected with the signal path 316 at a first location 371 and with the ground plane 312 at a second location 373 by vias 374. The vias 374 may be connected by intermediary layers 376. The fourth inductor 370 of the filter 300 may correspond with the fourth inductor 220 of the of the circuit diagram 200 of FIG. 2. The fourth inductor 370 of the filter 300 may be connected with the signal path 316 at the portion 361 of the signal path 316 that is electrically connected with the output 320. The fourth inductor 370 may have three corners 372 and form approximately one quarter of a loop.

A fourth capacitor may include a conductive layer 380 that is capacitively coupled with the portion 361 of the signal path 316 that is connected with the output 320. The conductive layer 380 of the fourth capacitor may be electrically connected with the ground plane 312 by vias 382. The fourth capacitor may correspond with the fourth capacitor 222 of the circuit diagram 200 of FIG. 2.

Figure 6A:
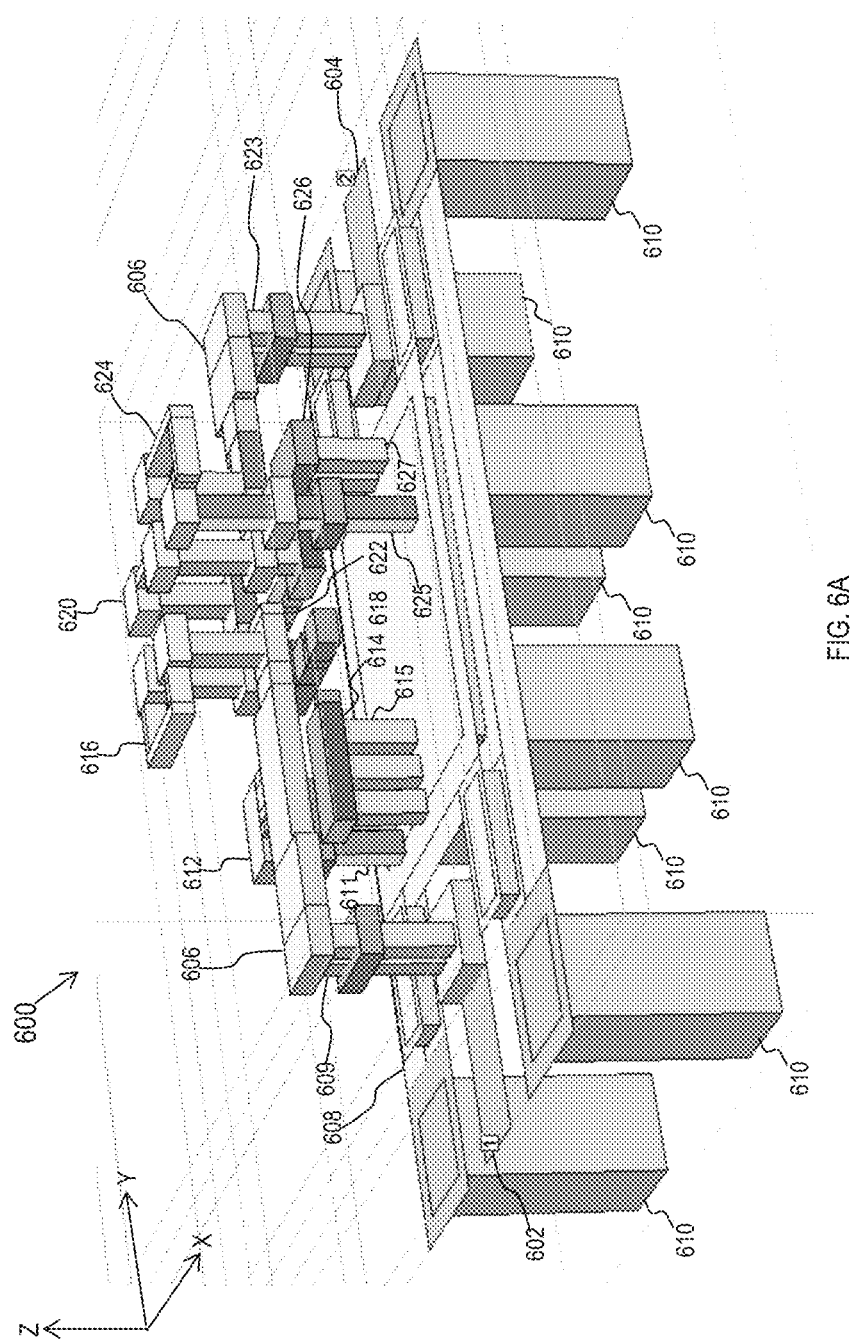
FIGS. 6A and 6B are perspective views of another embodiment of a multilayer filter according to aspects of the present disclosure.
Figure 6B:
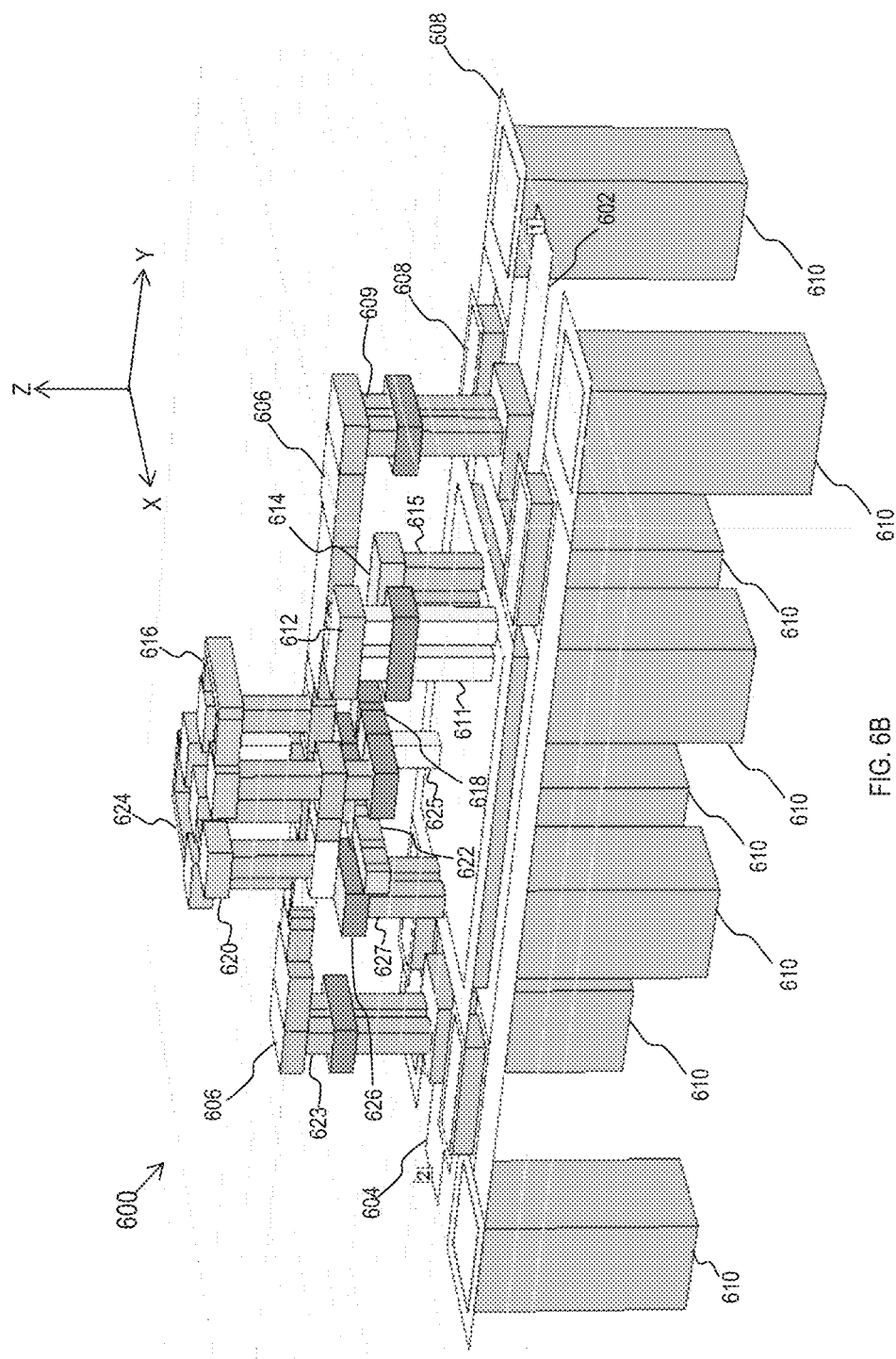

FIG. 6A illustrates a perspective view of another embodiment of a multilayer filter 600 according to aspects of the present disclosure. FIG. 6B illustrates another perspective view of the multilayer filter 600 of FIG. 6A. The filter 600 may generally be configured in a similar manner as the filter 300 described above with reference to FIGS. 3 through 5D. The filter 600 may include an input 602, an output 604, and a signal path 606 connecting the input 602 and the output 604. The filter 600 may also include a ground plane 608 electrically connected with one or more ground electrodes 610.

The filter 600 may include a first inductor 612 that is electrically connected with the ground plane 608. The first inductor 612 may correspond with the first inductor 208 of the circuit diagram 200 described above with reference to FIG. 2. The filter 600 may include a first capacitor 614 electrically coupled with the ground plane 608. The first capacitor 614 may correspond with the first capacitor 210 of the circuit diagram 200 described above with reference to FIG. 2.

The filter 600 may include a second inductor 616 and a second capacitor 618 that are connected in parallel with each other. The second inductor 616 and second capacitor 618 may correspond with the second inductor 212 and second capacitor 214, respectively, of the circuit diagram 200 described above with reference to FIG. 2. The second inductor 616 and second capacitor 618 may form a portion of the signal path 606 between the input 602 and the output 604. The filter 600 may include a third inductor 620 and third capacitor 622 that are connected in parallel with each other and may form a portion of the signal path 606 between the input 602 and the output 604. The third inductor 620 and third capacitor 622 may correspond with the third inductor 216 and third capacitor 218, respectively, of the circuit diagram 200 described above with reference to FIG. 2. Lastly, the filter 600 may include a fourth inductor 624 and fourth capacitor 626 that are connected in parallel with each other and connected between the signal path 606 and the ground plane 608. The fourth inductor 624 and fourth capacitor 626 may correspond with the fourth inductor 220 and the fourth capacitor 222, respectively, of the circuit diagram 200 described above with reference to FIG. 2.

The inductors 612, 616, 620, 624 and capacitors 614, 618, 622, 626 may be connected by vias 627 in a similar manner as described above with reference to FIGS. 3 through 5D. Each of the inductors 612, 616, 620, 624 may be connected with the signal path 606 at a respective first location and connected with the signal path 606 or the ground plane 608 at a respective second location. Each of the inductors 612, 616, 620, 624 may have a respective effective length (e.g., in the X-Y plane) between the first location and the second location. Additionally, each of the inductors 612, 616, 620, 624 may have a respective width along its respective effective length.

Figure 6C:
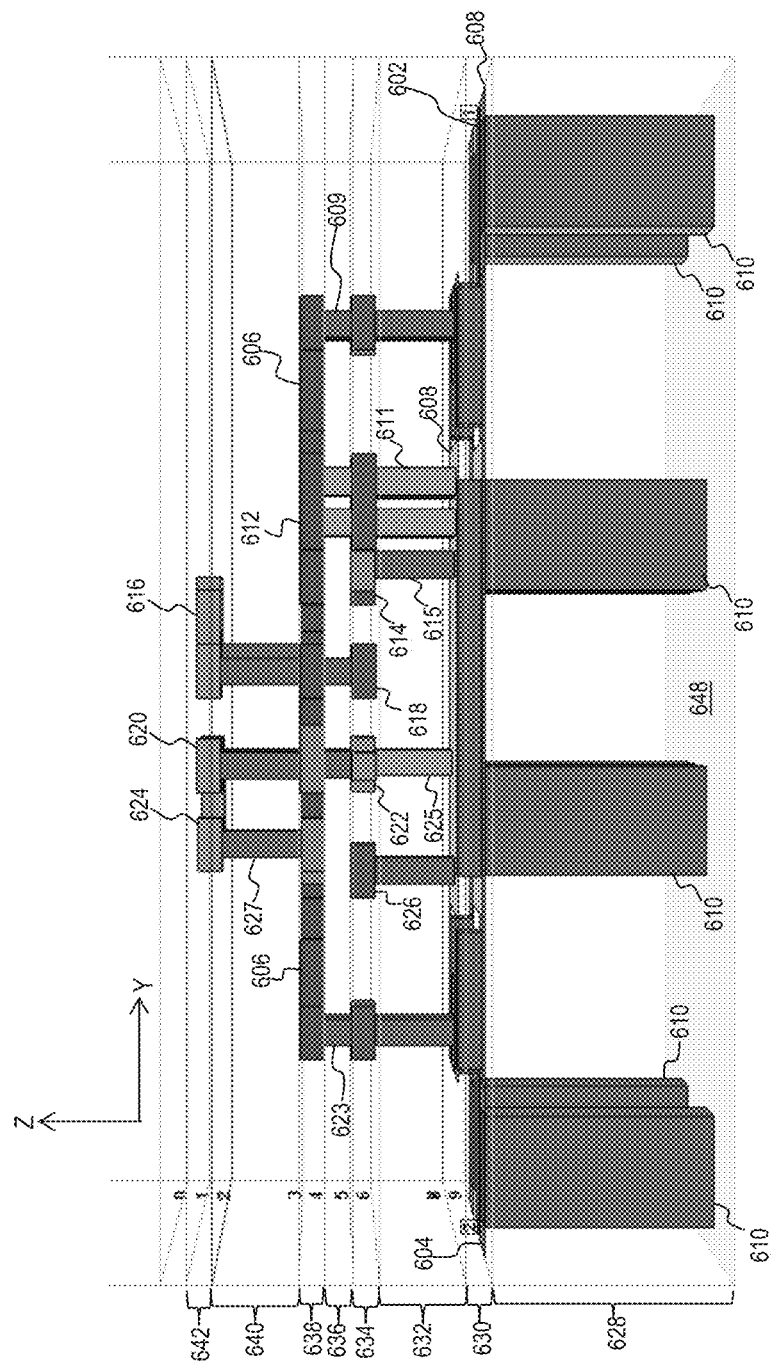
FIG. 6C is a side elevation view of the filter of FIGS. 6A and 6B.

FIG. 6C is a side elevation view of the filter 600 of FIGS. 6A and 6B. The band pass filter 600 may include a plurality of dielectric layers (transparent for clarity in FIGS. 6A and 6B). Referring to FIG. 6C, a first layer 632, a second layer 636, and a third layer 640 may be stacked to form a monolithic structure.

Conductive layers 630, 634, 638, 642 may be formed on the dielectric layers 632, 636, 640. Conductive layer 630 may be formed on a bottom surface of the first dielectric layer 632. Conductive layers 634, 638 may be formed on a top surface and a bottom surface, respectively of the second dielectric layer 636. Conductive layer 642 may be formed on a top surface of the third dielectric layer 640.

FIGS. 7A through 7D are a series of sequential top down views of the filter 600 of FIGS. 6A through 6C in which an additional dielectric layer is shown in each Figure. More specifically, FIG. 7A illustrates a mounting surface 628, such as a printed circuit board. The first conductive layers 630 may include the ground plane 608, which may be formed on a bottom surface and a top surface of the first layer 632. FIG. 7B additionally illustrates the second conductive layer 634 formed on the first dielectric layer 632. The second conductive layer 634 may include the first capacitor 614, second capacitor 618, third capacitor 622 and forth capacitor 626. FIG. 7C additionally illustrates the third conductive layer 638 that is formed on the second dielectric layer 636. The third conductive layer 638 may include portions of the signal path 606 and the first inductor 612. FIG. 7D illustrates the fourth conductive layer 642 formed on the third dielectric layer 640. The fourth conductive layer 642 may include the second inductor 616, third inductor 620, and fourth inductor 624. The dielectric layers 632, 636, 640 are transparent to show the relative relocations of the various patterned conductive layers 630, 634, 638, 642.

Figure 8A:
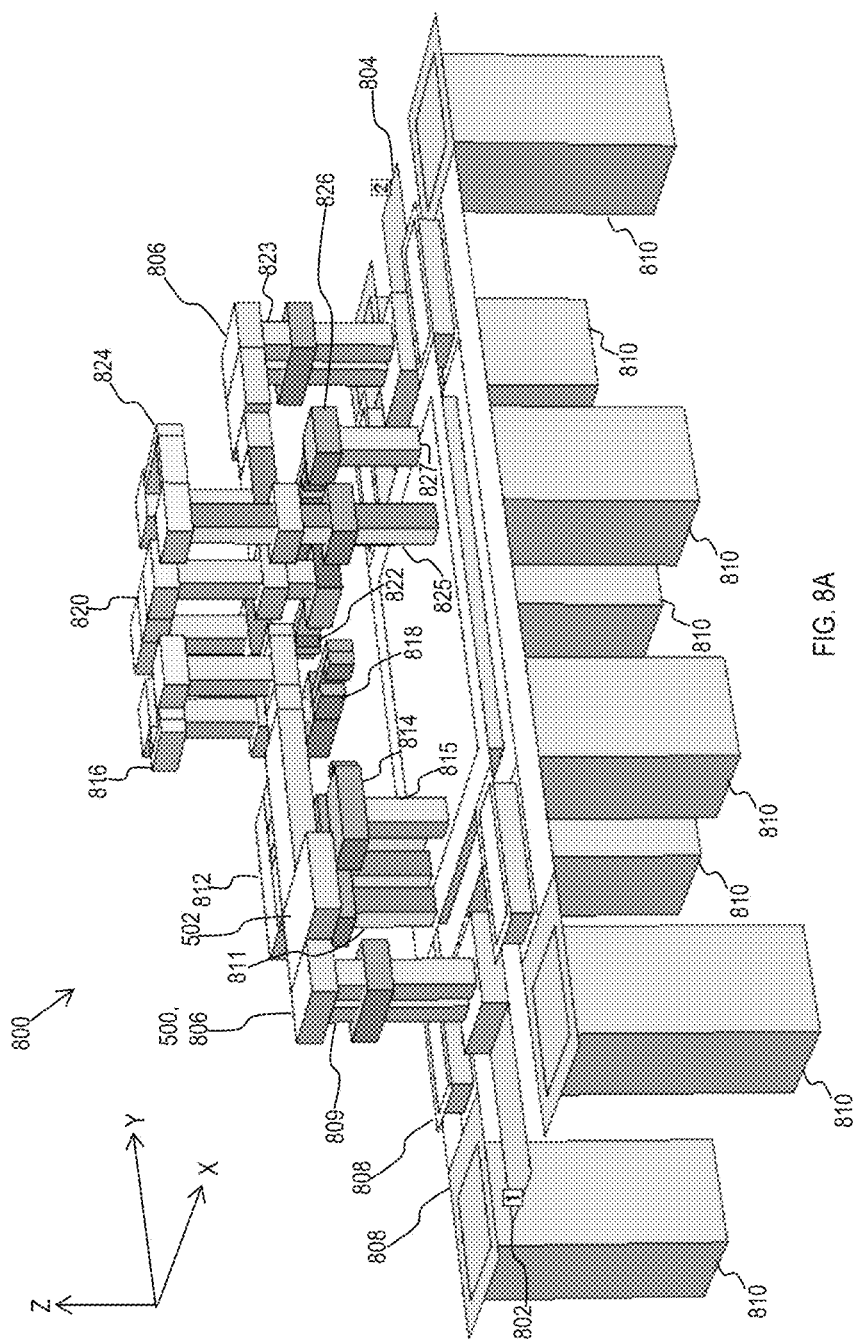
FIG. 8A is a perspective view of another embodiment of a multilayer filter according to aspects of the present disclosure.

FIG. 8A illustrates a perspective view of another embodiment of a multilayer filter 800 according to aspects of the present disclosure. The filter 800 may generally be configured in a similar manner as the filter 300 described above with reference to FIGS. 3 through 5D. The filter 800 may include an input 802, an output 804, and a signal path 806 connecting the input 802 and the output 804. The filter 800 may also include a ground plane 808 electrically connected with one or more ground electrodes 810.

The filter 800 may include a first inductor 812 that is electrically connected with the ground plane 808. The first inductor 812 may correspond with the first inductor 208 of the circuit diagram 200 described above with reference to FIG. 2. The filter 800 may include a first capacitor 814 electrically coupled with the ground plane 808. The first capacitor 814 may correspond with the first capacitor 210 of the circuit diagram 200 described above with reference to FIG. 2. The filter 800 may include a second inductor 816 and second capacitor 818 that are connected in parallel with each other. The second inductor 816 and second capacitor 818 may correspond with the second inductor 212 and second capacitor 214, respectively, of the circuit diagram 200 described above with reference to FIG. 2. The second inductor 816 and second capacitor 818 may form a portion of the signal path 806 between the input 802 and the output 804. The filter 800 may include a third inductor 820 and third capacitor 822 that are connected in parallel with each other and may form a portion of the signal path 806 between the input 802 and the output 804. The third inductor 820 and third capacitor 822 may correspond with the third inductor 216 and third capacitor 218, respectively, of the circuit diagram 200 described above with reference to FIG. 2. Lastly, the filter 800 may include a fourth inductor 824 and fourth capacitor 826 that are connected in parallel with each other and connected between the signal path 806 and the ground plane 808. The fourth inductor 824 and fourth capacitor 826 may correspond with the fourth inductor 220 and the fourth capacitor 222, respectively, of the circuit diagram 200 described above with reference to FIG. 2.

The inductors 812, 816, 820, 824 and capacitors 814, 818, 822, 826 may be connected by vias 827 in a similar manner as described above with reference to FIGS. 3 through 5D. Each of the inductors 812, 816, 820, 824 may be connected with the signal path 806 at a respective first location and connected with the signal path 806 or the ground plane 808 at a respective second location. Each of the inductors 812, 816, 820, 824 may have a respective effective length (e.g., in the X-Y plane) between the first location and the second location. Additionally, each of the inductors 812, 816, 820, 824 may have a respective width along its respective effective length.

Figure 8B:
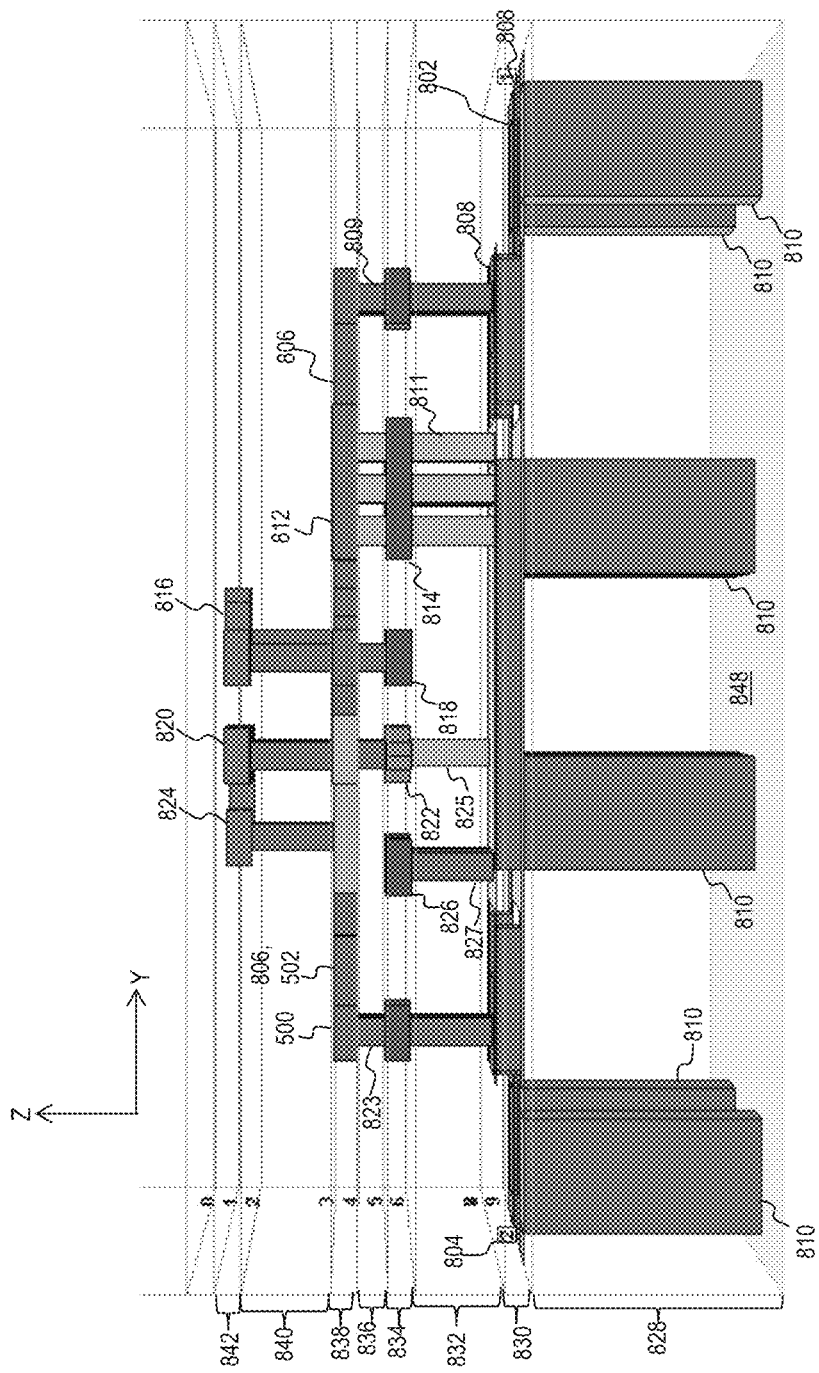
FIG. 8B is a side elevation view of the filter of FIG. 8A.

FIG. 8B is a side elevation view of the filter 800 of FIG. 8A. The band pass filter 800 may include a plurality of dielectric layers (transparent for clarity in FIG. 8A). Referring to FIG. 8B, a first layer 832, a second layer 836, and a third layer 840 may be stacked to form a monolithic structure. Conductive layers 830, 834, 838, 842 may be formed on the dielectric layers 832, 836, 840. Conductive layer 830 may be formed on a bottom surface of the first dielectric layer 832. Conductive layers 834, 838 may be formed on a top surface and a bottom surface, respectively of the second dielectric layer 836. Conductive layer 842 may be formed on a top surface of the third dielectric layer 840.

FIGS. 9A through 9D are a series of sequential top down views of the filter 800 of FIGS. 8A and 8B in which an additional dielectric layer is shown in each Figure. More specifically, FIG. 9A illustrates a mounting surface 828, such as a printed circuit board. The first conductive layers 830 may include the ground plane 808, which may be formed on a bottom surface and a top surface of the first layer 832. FIG. 9B additionally illustrates the second conductive layer 834 formed on the first dielectric layer 832. The second conductive layer 834 may include the first capacitor 814, second capacitor 818, third capacitor 822 and forth capacitor 826. FIG. 9C additionally illustrates the third conductive layer 838 that is formed on the second dielectric layer 836. The third conductive layer 838 may include portions of the signal path 806 and the first inductor 812. FIG. 9D illustrates the fourth conductive layer 842 formed on the third dielectric layer 840. The fourth conductive layer 842 may include the second inductor 816, third inductor 820, and fourth inductor 824. The dielectric layers 832, 836, 840 are transparent to show the relative relocations of the various patterned conductive layers 830, 834, 838, 842.

Figure 10A:
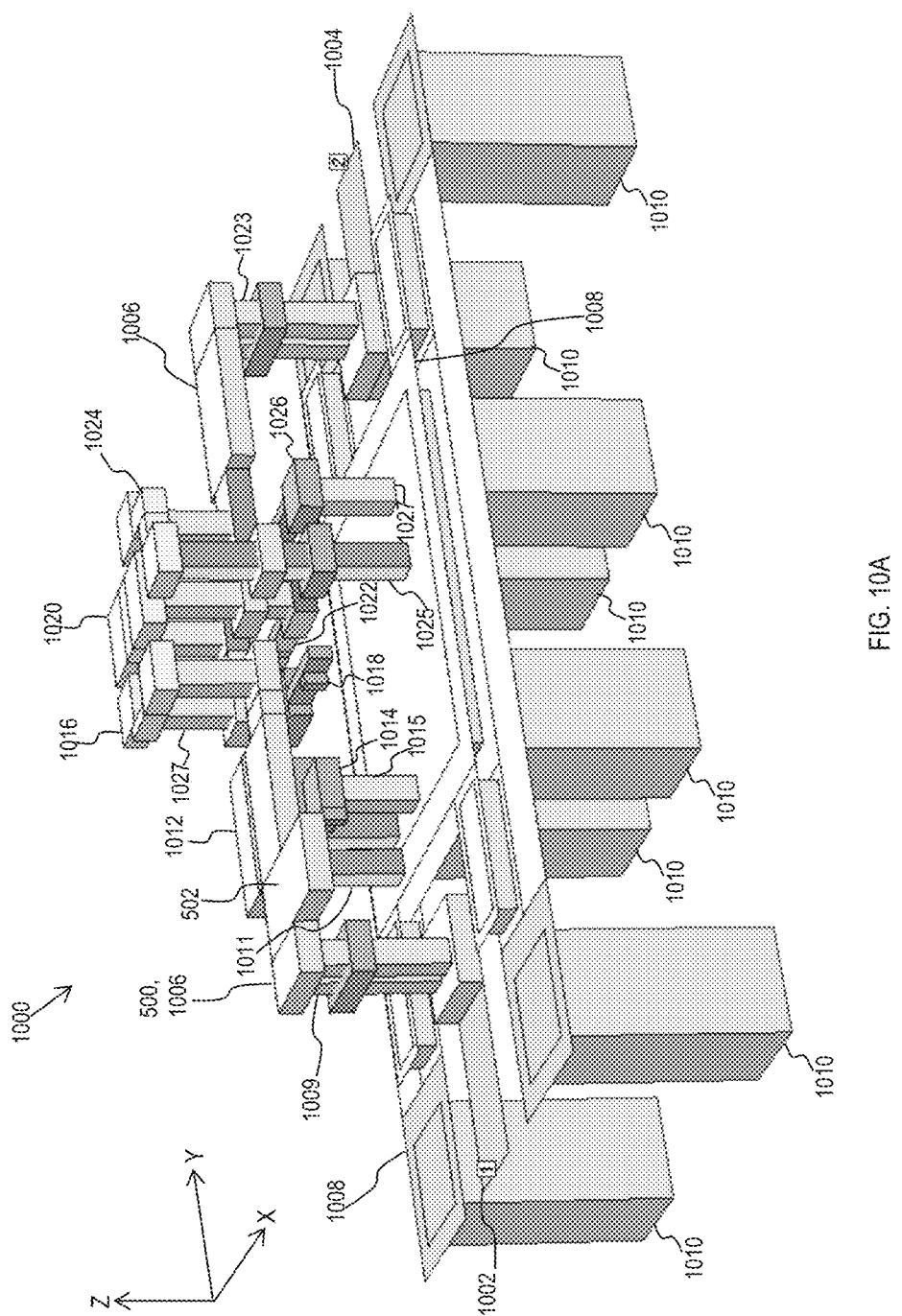
FIG. 10A is a perspective view of another embodiment of a multilayer filter according to aspects of the present disclosure.

FIG. 10A illustrates a perspective view of another embodiment of a multilayer filter 1000 according to aspects of the present disclosure. FIG. 10B illustrates another perspective view of the multilayer filter 1000 of FIG. 10A. The filter 1000 may generally be configured in a similar manner as the filter 300 described above with reference to FIGS. 3 through 5D. The filter 1000 may include an input 1002, an output 1004, and a signal path 1006 connecting the input 1002 and the output 1004. The filter 1000 may also include a ground plane 1008 electrically connected with one or more ground electrodes 1010.

The filter 1000 may include a first inductor 1012 that is electrically connected with the ground plane 1008. The first inductor 1012 may correspond with the first inductor 208 of the circuit diagram 200 described above with reference to FIG. 2. The filter 1000 may include a first capacitor 1014 electrically coupled with the ground plane 1008. The first capacitor 1014 may correspond with the first capacitor 210 of the circuit diagram 200 described above with reference to FIG. 2. The filter 1000 may include a second inductor 1016 and second capacitor 1018 that are connected in parallel with each other. The second inductor 1016 and second capacitor 1018 may correspond with the second inductor 212 and second capacitor 214, respectively, of the circuit diagram 200 described above with reference to FIG. 2. The second inductor 1016 and second capacitor 1018 may form a portion of the signal path 1006 between the input 1002 and the output 1004. The filter 1000 may include a third inductor 1020 and third capacitor 1022 that are connected in parallel with each other and may form a portion of the signal path 1006 between the input 1002 and the output 1004. The third inductor 1020 and third capacitor 1022 may correspond with the third inductor 216 and third capacitor 218, respectively, of the circuit diagram 200 described above with reference to FIG. 2. Lastly, the filter 1000 may include a fourth inductor 1024 and fourth capacitor 1026 that are connected in parallel with each other and connected between the signal path 1006 and the ground plane 1008. The fourth inductor 1024 and fourth capacitor 1026 may correspond with the fourth inductor 220 and the fourth capacitor 222, respectively, of the circuit diagram 200 described above with reference to FIG. 2.

The inductors 1012, 1016, 1020, 1024 and capacitors 1014, 1018, 1022, 1026 may be connected by vias 1027 in a similar manner as described above with reference to FIGS. 3 through 5D. Each of the inductors 1012, 1016, 1020, 1024 may be connected with the signal path 1006 at a respective first location and connected with the signal path 1006 or the ground plane 1008 at a respective second location. Each of the inductors 1012, 1016, 1020, 1024 may have a respective effective length (e.g., in the X-Y plane) between the first location and the second location. Additionally, each of the inductors 1012, 1016, 1020, 1024 may have a respective width along its respective effective length.

FIG. 10B is a side elevation view of the filter 1000 of FIGS. 10A and 10B. The band pass filter 1000 may include a plurality of dielectric layers (transparent for clarity in FIG. 10A). Referring to FIG. 10B, a first layer 1032, a second layer 1036, a third layer 1040 may be stacked to form a monolithic structure. Conductive layers 1030, 1034, 1038, 1042 may be formed on the dielectric layers 1032, 1036, 1040. Conductive layer 1030 may be formed on a bottom surface of the first dielectric layer 1032. Conductive layers 1034, 1038 may be formed on a top surface and a bottom surface, respectively of the second dielectric layer 1036. Conductive layer 1042 may be formed on a top surface of the third dielectric layer 1040.

Figures 11C, 11D:
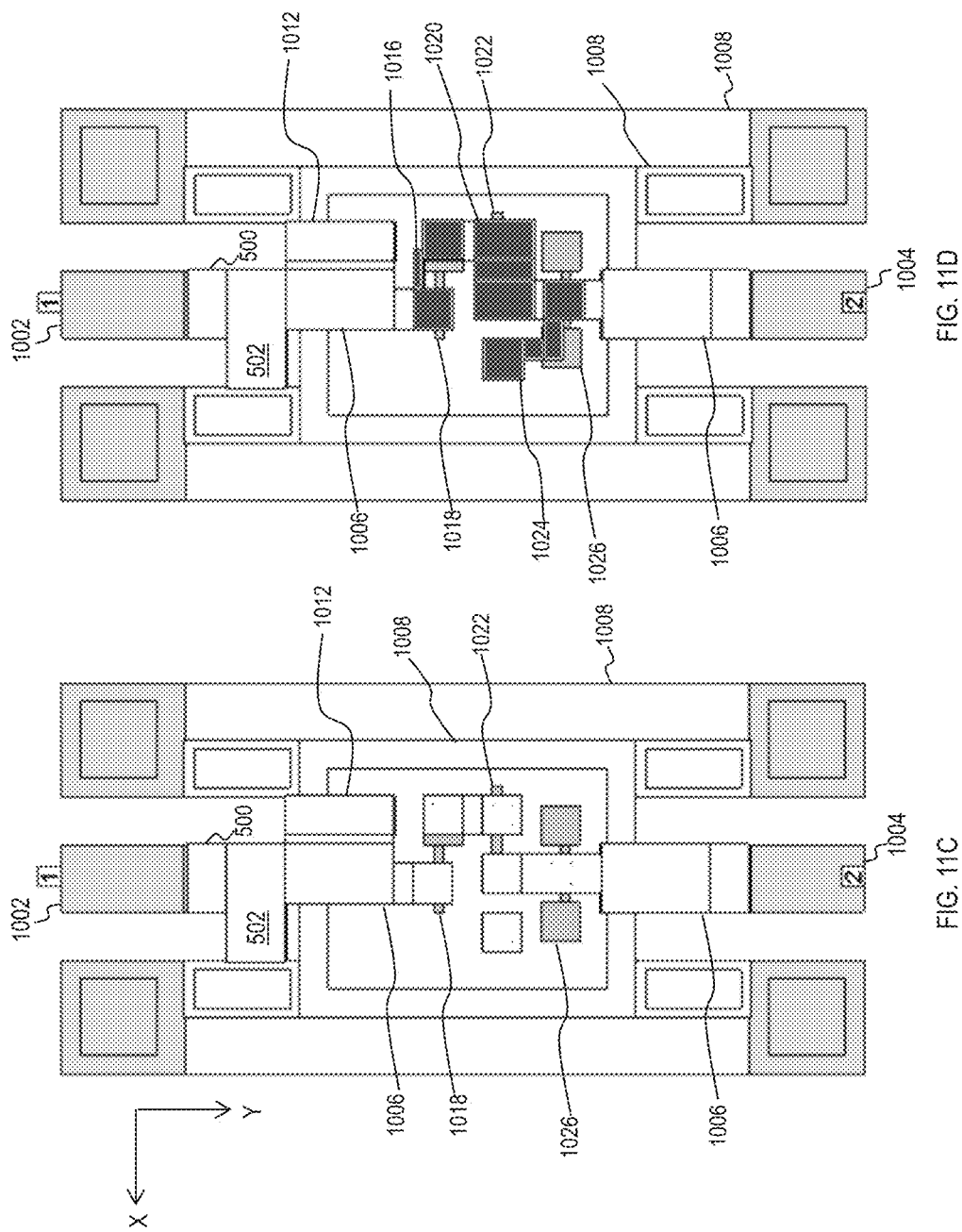

FIGS. 11A through 11D are a series of sequential top down views of the filter 1000 of FIGS. 10A and 10B in which an additional dielectric layer is shown in each Figure. More specifically, FIG. 11A illustrates a mounting surface 1028, such as a printed circuit board. The first conductive layer 1030 may include the ground plane 1008, which may be formed on a bottom surface and a top surface of the first layer 1030. FIG. 11B additionally illustrates the second conductive layer 1034 formed on the first dielectric layer 1032. The second conductive layer 1034 may include the first capacitor 1014, second capacitor 1018, third capacitor 1022 and forth capacitor 1026. FIG. 11C additionally illustrates the third conductive layer 1038 that is formed on the second dielectric layer 1036. The third conductive layer 1038 may include portions of the signal path 1006 and the first inductor 1012. FIG. 11D illustrates the fourth conductive layer 1042 formed on the third dielectric layer 1040. The fourth conductive layer 1042 may include the second inductor 1016, third inductor 1020, and fourth inductor 1024. The dielectric layers 1032, 1036, 1040 are transparent to show the relative relocations of the various patterned conductive layers 1030, 1034, 1038, 1042.

II. Return Loss Reduction Protrusion

FIG. 5 is a top down view of a conductive layer 500 of a signal path of a multilayer filter according to aspects of the present disclosure. The signal path may correspond with the signal path 806 of the multilayer filter 800 described above with reference to FIGS. 8A through 9D and/or the signal path 1006 of the multilayer filter 1000 described above with reference to FIGS. 10A through 11D. Additionally, in some embodiments, the filter 300 described above with reference to FIGS. 3A through 4E and/or the filter 600 described above with reference to FIGS. 6A through 7D may be configured to include a protrusion as described herein.

The conductive layer 500 of the signal path 806 may be elongated in a first direction (e.g., the Y-direction) and may include a protrusion 512 extending in the second direction (e.g., the X-direction). More specifically, the conductive layer 500 may have a first edge 504 and a second edge 506. Each of the first edge 504 and second edge 506 may be parallel with the first direction (e.g., the Y-direction). The first edge 504 may be approximately aligned with the second edge 506. For example, a distance 507 may be defined in the second direction (e.g., the X-direction) between the first edge 504 and the second edge 506. In some embodiments, the distance 507 may be less than 200 microns.

The protrusion 502 may be located between the first edge 504 and the second edge 506 in the first direction (e.g., the Y-direction). The protrusion 502 may have an end edge 508 that may be parallel with the first edge 504. The end edge 508 may be offset from the first edge 504 in the second direction (e.g., the X-direction) by a protrusion length 510. The protrusion length 510 may be greater than about 50 microns.

The protrusion 502 may be located relatively close to a vertical electrical connection 512 with the input 802 (illustrated in FIGS. 8A through 9D). The vertical electrical connection 512 may include one or more vias, for example as described with reference to FIGS. 8A through 9D. For example, the vertical electrical connection 512 may generally be configured as described above with reference to FIGS. 3A through 4E with reference to the vias 326 that electrically connect the intermediary layer 324 with the conductive layer 328 formed on the second dielectric layer 306. Alternatively, in other embodiments, the vertical electrical connection 512 may be or include a castellation or external termination.

The protrusion 502 may have a first side edge 514 that is parallel with the second direction (e.g., X-direction). The first side edge 514 may extend between the end edge 508 and the first edge 504. A distance 516 may be defined in the first direction (e.g., the Y-direction) between the first side edge 514 and the electrical connections 512. In some embodiments, the distance 516 may be less than about 500 microns.

The protrusion 502 may have a second side edge 518 that is parallel with the second direction (e.g., X-direction). Thus, the second side edge 518 may be parallel with the first side edge 514. The second side edge 518 may extend (e.g., connect) between the end edge 508 and the second edge 506. The second side edge 518 may be spaced apart from the first side edge 514 by a protrusion width 520. In some embodiments, the protrusion width 520 may be greater than about 100 microns.

The second edge 506 of the protrusion 502 may be approximately aligned with an edge 522 of a first inductor 812. The edge 522 of the first inductor 812 may be aligned with the second direction (e.g., X-direction). The first inductor 812 is described above with reference to FIGS. 8A through 9D. A distance in the first direction (e.g., Y-direction) may be defined between the second edge 506 of the protrusion and the first inductor 812. The distance may be less than about 200 microns. In this example, the distance is about 0 microns.

The conductive layer 500 of the signal path 316 may have a first width 524 in the second direction (e.g., the X-direction) between first edge 504 and a third edge 526. The third edge 526 may be parallel with the first edge 504.

The conductive layer 500 of the signal path 316 may have a second width 528 in the second direction (e.g., the X-direction). The second width 528 may be defined between the end edge 508 and the third edge 526 in the second direction (e.g., the X-direction).

The conductive layer 500 of the signal path 316 may have a third width 530 in the second direction (e.g., the X-direction). The third width 530 may be defined between the second edge 506 and the third edge 526 in the second direction (e.g., the X-direction).

The conductive layer 500 of the signal path 316 may be free of electrical connections at the protrusion 502. For example, the conductive layer 500 may be free of electrical connections between the side edges 514, 518 in the first direction (e.g., Y-direction) and/or between the end edge 508 and the first edge 504 in the second-direction (e.g., X-direction).

In some embodiments, the conductive layer 500 of the signal path 316 may be asymmetric about the first direction (e.g., Y-direction). More specifically, the conductive layer 500 may not include another protrusion extending in the second direction (e.g., Y-direction) from the third edge 526. However, in other embodiments, the conductive layer 500 may include multiple protrusions in any suitable arrangement, including symmetrically about the first direction (e.g., Y-direction).

III. Applications

The various embodiments of the filter described herein may find application in any suitable type of electrical component. The filter may find particular application in devices that receive, transmit, or otherwise employ high frequency radio signals. Example applications include smartphones, signal repeaters (e.g., small cells), relay stations, and radar.

EXAMPLES

Computer modeling was used to simulate multilayer filters according to aspects of the present disclosure. Additionally, filters were built and tested. It should be understood that the following dimensions are merely given as examples and do not limit the scope of the present disclosure.

Various multilayer filters (including the multilayer filters 800, 1000 described above) were modeled including a signal path having a conductive layer including protrusions with the following dimensions:

TABLE 1

| Example Protrusion Dimensions | | |
|---|---|---|
| | Filter 800 | Filter 1000 |
| Approximate Pass Band (GHz) | 34.5-37.5 | 43-46.5 |
| Protrusion length 510 (microns) | 203 | 254 |
| Protrusion width 520 (microns) | 305 | 305 |

TABLE 1-continued

| Example Protrusion Dimensions | | |
|---|---|---|
| | Filter 800 | Filter 1000 |
| First width 524 (microns) | 355 | 355 |
| Second width 528 (microns) | 560 | 609 |
| Third width 530 (microns) | 305 | 305 |
| Distance 507 between the first edge 504 and the second edge 506 (microns) | 51 | 51 |
| Distance 516 between the first side edge 514 and the vertical electrical connections 512 (microns) | 51 | 51 |

The thicknesses of the dielectric layers may generally be less than about 180 micrometers ("microns"). For instance, in some embodiments, the first layers 304, 632, 832, 1032 may be about 60 microns thick. The second layers 306, 636, 836, 1036 may be about 20 microns thick. The third layers 308, 640, 840, 1040 may be about 60 microns thick.

In some embodiments, the overall length of the filters may be 4.3 mm. The overall width may be about 4 mm. The overall thickness may be about 230 microns.

Figure 12:
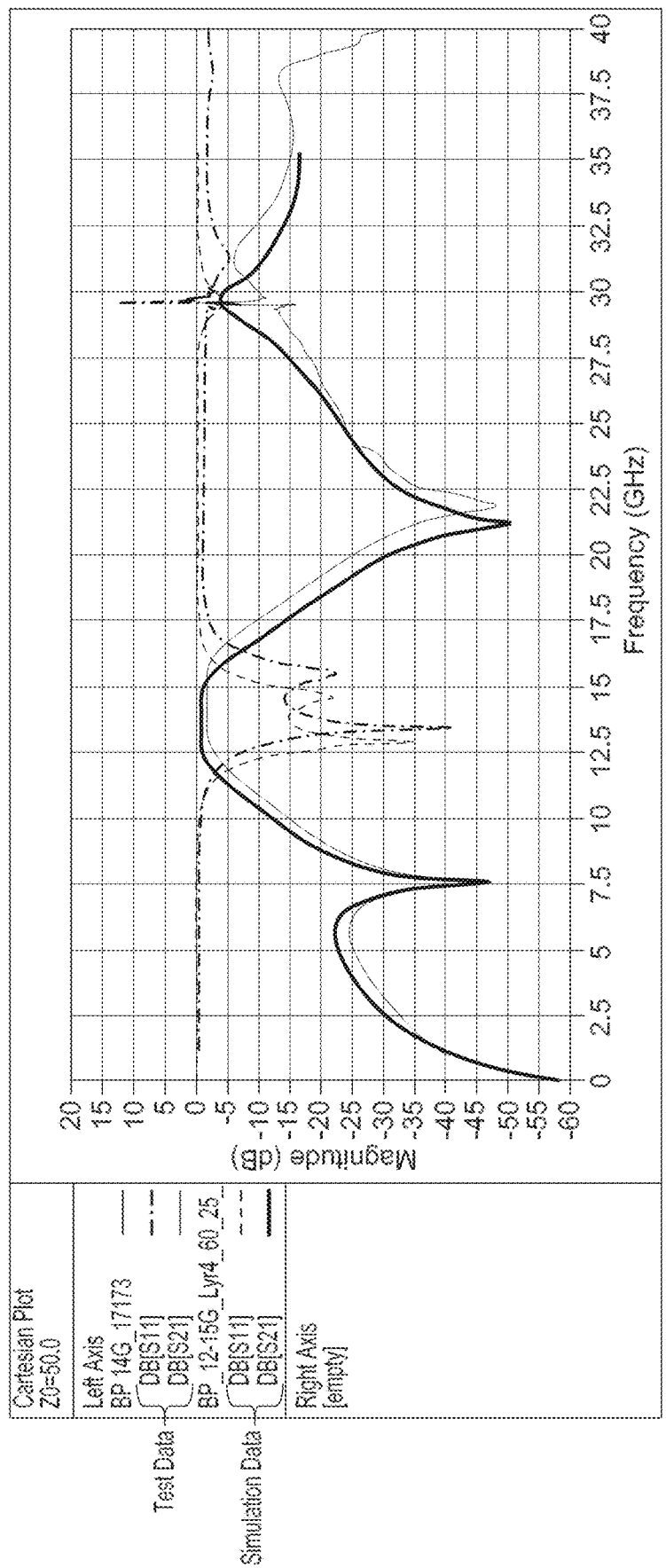
FIG. 12 is a plot of test data including measured insertion loss and return loss values for a filter constructed according to aspects of the present disclosure.

FIGS. 12-17 present test results and simulation data for the various filters. Referring to FIG. 12, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The measured pass band is from about 13.2 GHz to about 15.8 GHz.

Figure 13:
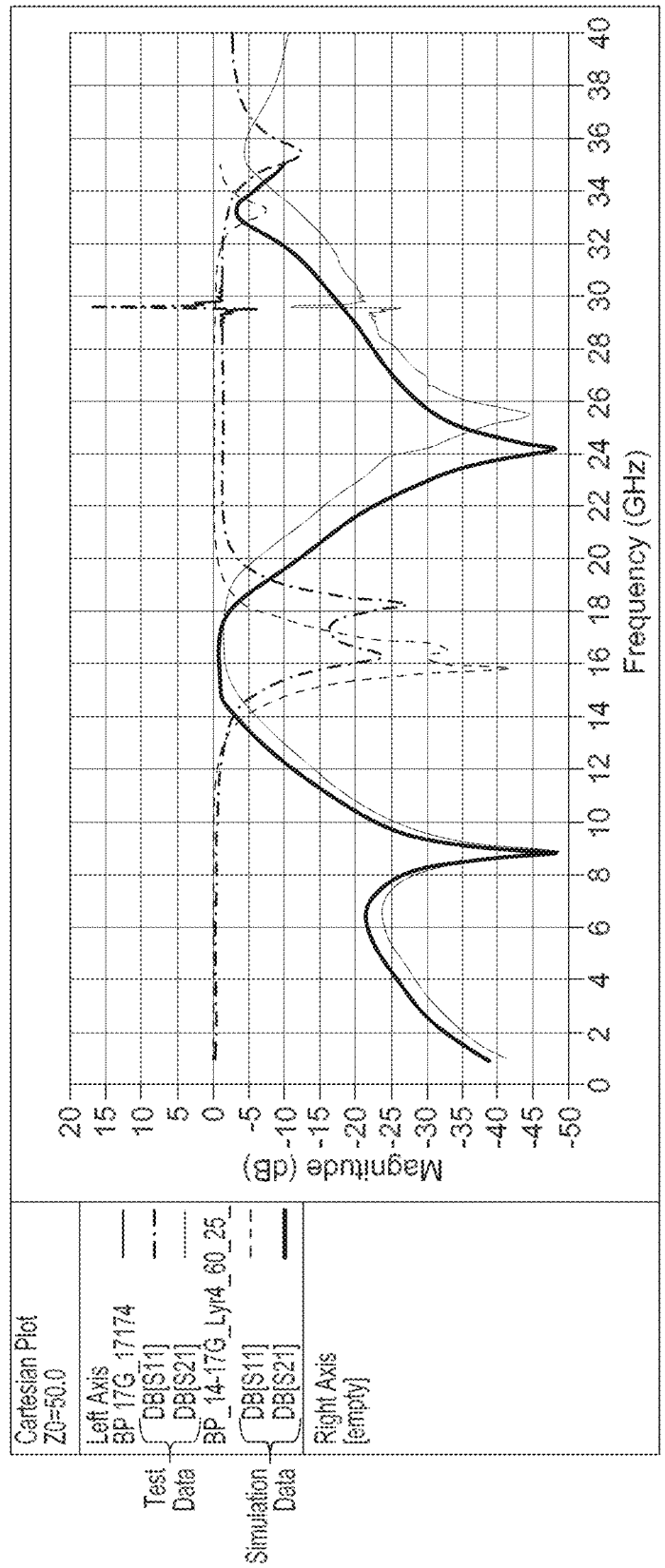
FIG. 13 is a plot of test data including measured insertion loss and return loss values for a filter constructed according to aspects of the present disclosure.

Referring to FIG. 13, a multilayer filter according to aspects of the present disclosure was built and tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 16.1 GHz to about 18.2 GHz.

Figure 14:
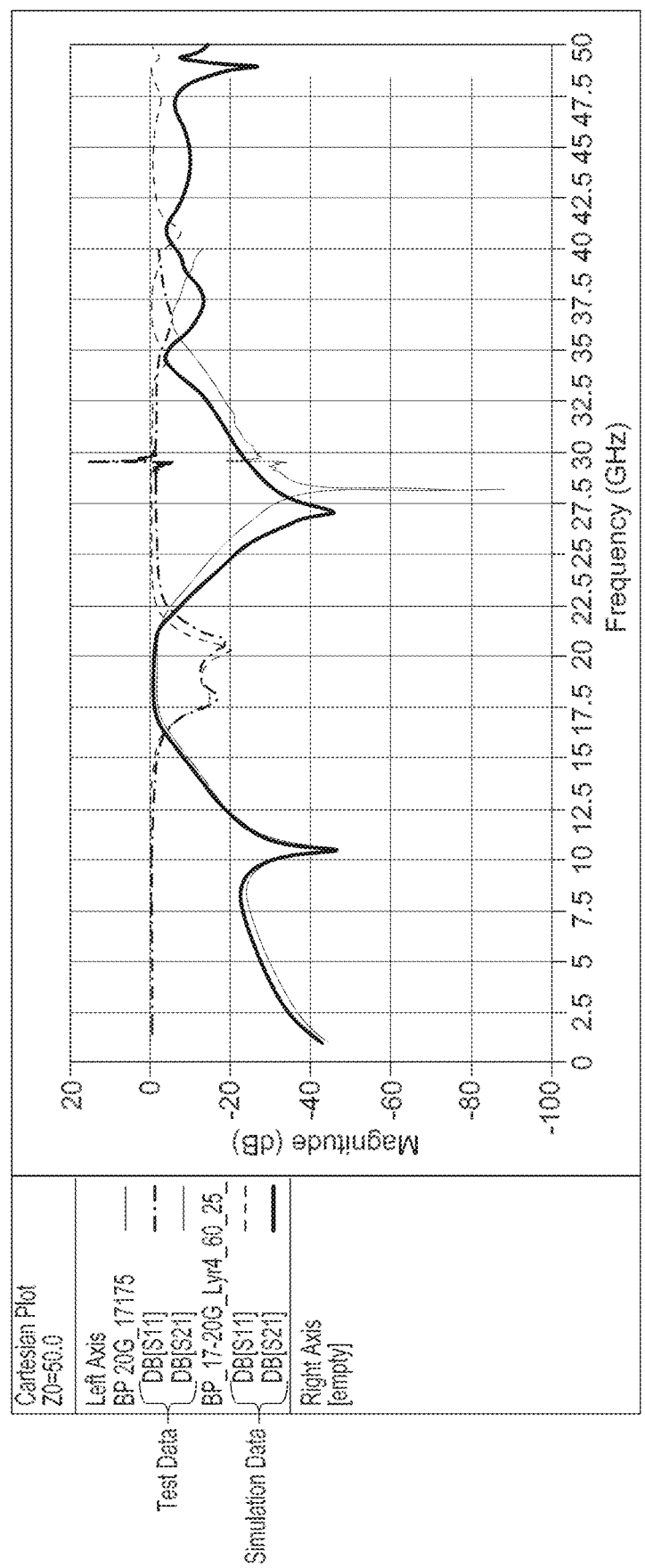
FIG. 14 is a plot of test data including measured insertion loss and return loss values for a filter constructed according to aspects of the present disclosure.

Referring to FIG. 14, the multilayer filter 300 described above with reference to FIGS. 3A through 4E was both simulated and built and physically tested. Measured insertion loss ($S_{21}$) values and measured return loss ($S_{11}$) values are plotted from 0 GHz to 45 GHz. Simulated insertion loss ($S_{21}$) values and simulated return loss ($S_{11}$) values are plotted from 0 GHz to 35 GHz. The pass band is from about 17.0 GHz to about 21.2 GHz.

Figure 15:
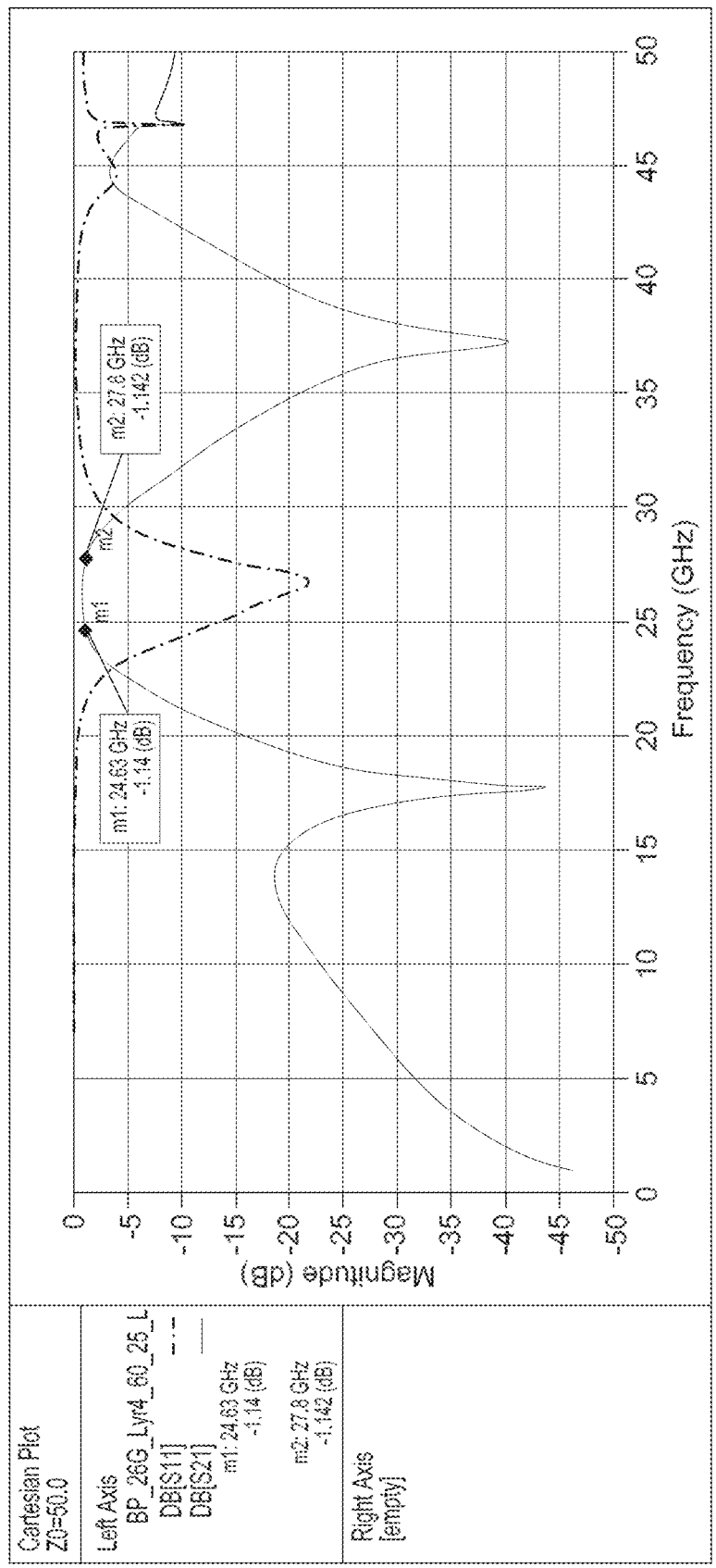
FIG. 15 is a plot of simulation data including insertion loss and return loss values from a computer analysis of a filter according to aspects of the present disclosure.

Referring to FIG. 15, the multilayer filter 600 described above with reference to FIGS. 6A through 7D was simulated. Simulated insertion loss ($S_{21}$) values and simulated return loss ($S_{11}$) values are plotted from 0 GHz to 50 GHz. The pass band is from about 24.6 GHz to about 27.8 GHz.

Figure 16A:
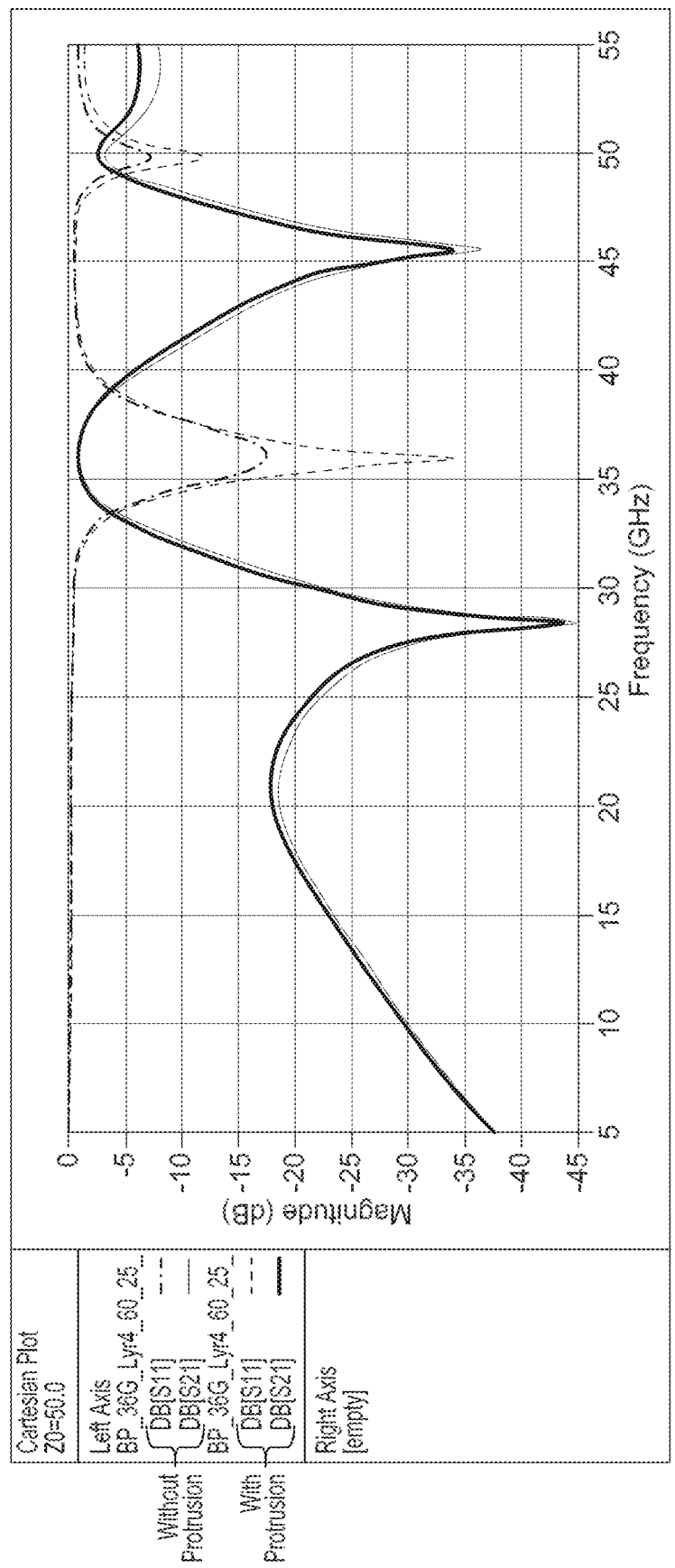
FIG. 16A is a plot of simulation data from a computer analysis of a filter including a protrusion according to aspects of the present disclosure and a filter that does not include a protrusion.

Referring to FIG. 16A, the multilayer filter 800 described above, which includes the protrusion 502, as described above with reference to FIGS. 5 and 8A through 9D was simulated. A modified version of the filter 800 that did not include the protrusion 502 was also simulated. FIG. 16A presents simulated insertion loss ($S_{21}$) values and simulated return loss ($S_{11}$) values from 0 GHz to 55 GHz for both versions of the filter 800. For each version, the pass band frequency range is from about 34.6 GHz to about 37.4 GHz. As shown in FIG. 16A, the return loss ($S_{11}$) values are far lower within the pass band frequency range.

Figure 16B:
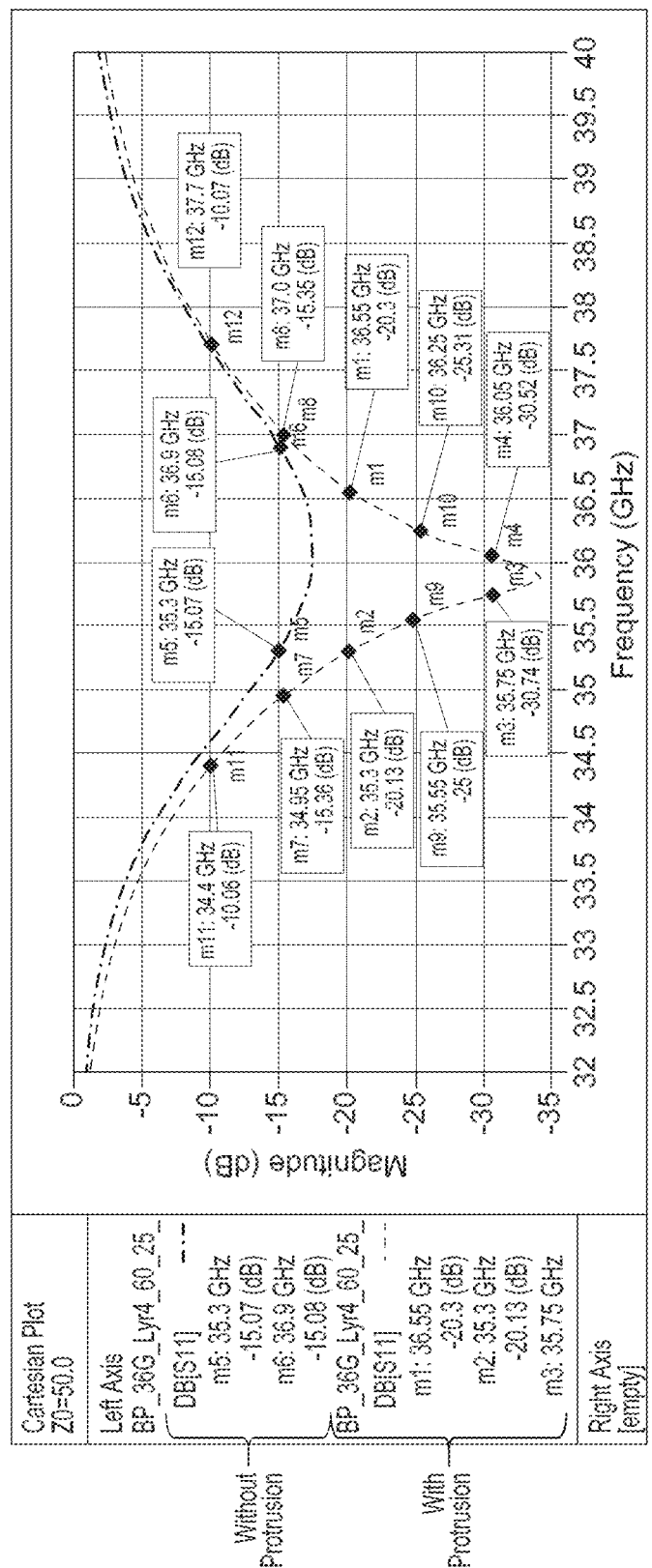
FIG. 16B is an enlarged portion of a plot of return loss from a computer analysis of a filter including a protrusion according to aspects of the present disclosure and a filter that does not include a protrusion.

FIG. 16B is a plot of the simulated return loss ($S_{11}$) values from 32 GHz to 40 GHz. As shown in FIG. 16B, the version of the filter 800, which includes protrusion 502 exhibits return loss values that are lower than the version of the filter lacking the protrusion 502. More specifically, the filter 800 with the protrusion 502 exhibits return loss ($S_{11}$) values as listed in the following table:

TABLE 2

Example Return Loss Values for Filter 800

| Frequency Range | Return Loss |
|---|---|
| 34.4 GHz to 37.7 GHz | Less than −10 dB |
| 34.95 GHz to 37.0 GHz | Less than −15 dB |
| 35.3 GHz to 36.55 GHz | Less than −20 dB |
| 35.55 GHz to 36.25 GHz | −25 dB or less |
| 35.75 GHz to 36.05 GHz | Less than −30 dB |

Figure 17A:
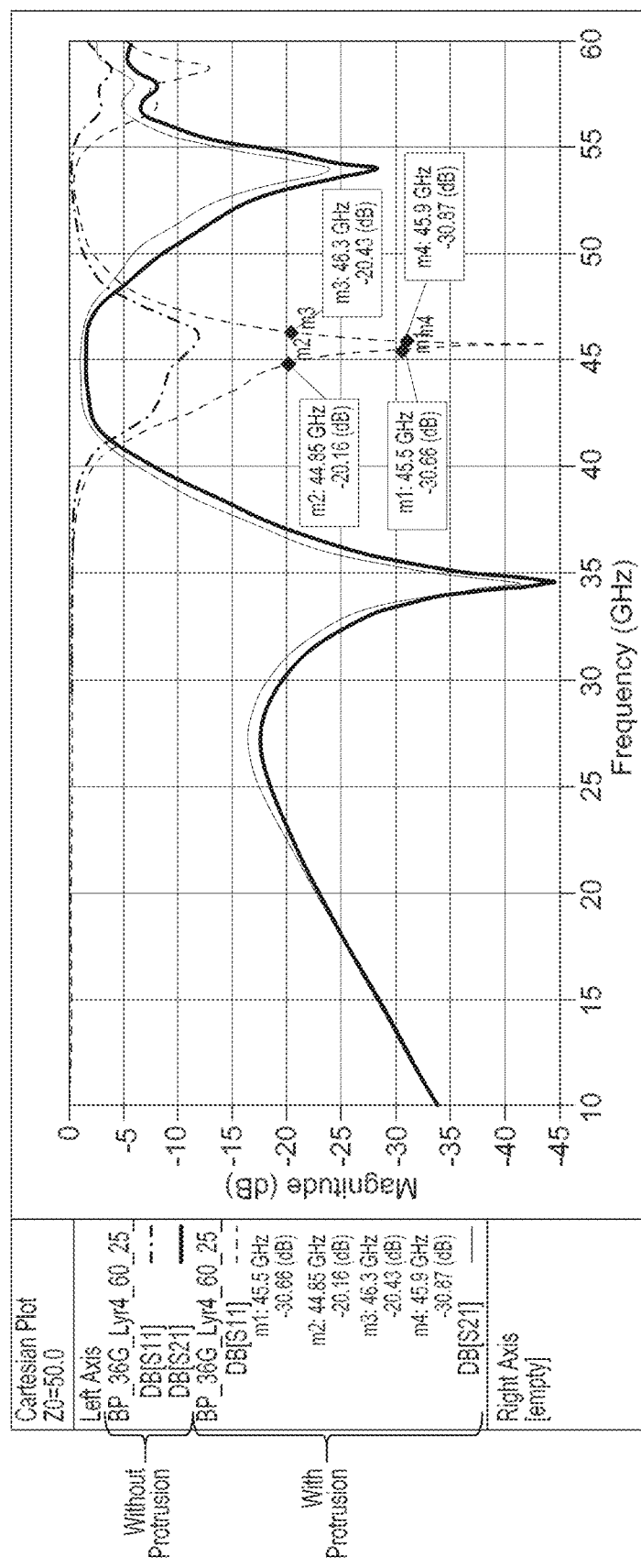
FIG. 17A is a plot of simulation data from a computer analysis of a filter including a protrusion according to aspects of the present disclosure and a filter that does not include a protrusion.

Referring to FIG. 17A, the multilayer filter 1000 described above, which includes the protrusion 502, as described above with reference to FIGS. 5 and 8A through 9D was simulated. A modified version of the filter 1000 that did not include the protrusion 502 was also simulated. FIG. 17A presents simulated insertion loss ($S_{21}$) values and simulated return loss ($S_{11}$) values from 0 GHz to 55 GHz for both versions of the filter 1000. For each version, the pass band frequency range is from about 42.9 GHz to about 46.6 GHz. As shown in FIG. 17A, the return loss ($S_{11}$) values are far lower within the pass band frequency range.

Figure 17B:
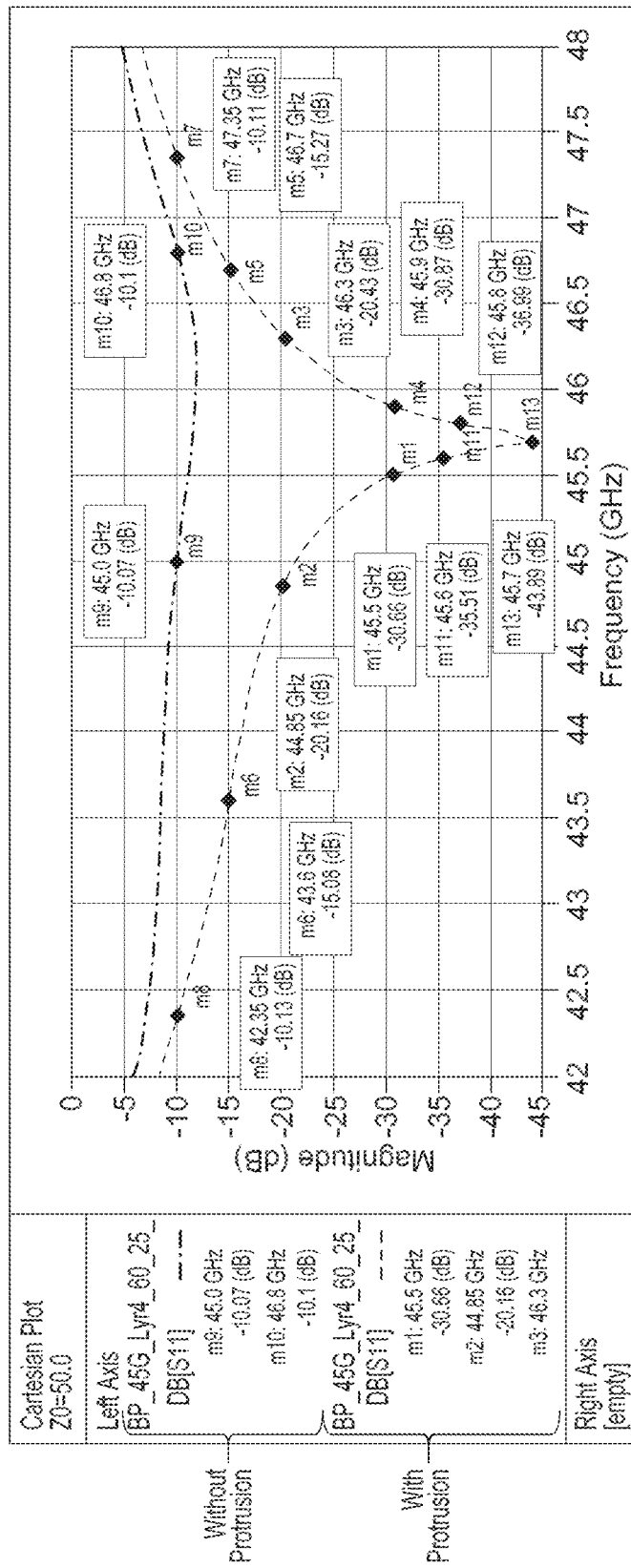
FIG. 17B is an enlarged portion of a plot of return loss from a computer analysis of a filter including a protrusion according to aspects of the present disclosure and a filter that does not include a protrusion.

FIG. 17B is a plot of the simulated return loss ($S_{11}$) values from 32 GHz to 40 GHz. As shown in FIG. 16B, the version of the filter 1000, which includes protrusion 502 exhibits return loss values that are lower than the version of the filter lacking the protrusion 502. More specifically, the filter 1000 with the protrusion 502 exhibits return loss ($S_{11}$) values as listed in the following table:

TABLE 3

Example Return Loss Values for Filter 1000

| Frequency Range | Return Loss |
|---|---|
| 42.35 GHz to 47.35 GHz | Less than −10 dB |
| 43.6 GHz to 46.7 GHz | Less than −15 dB |
| 44.85 GHz to 46.3 GHz | Less than −20 dB |
| 45.5 GHz to 45.9 GHz | −25 dB or less |
| 45.6 GHz to 45.8 GHz | Less than −30 dB |

Test Methods

Figure 18:
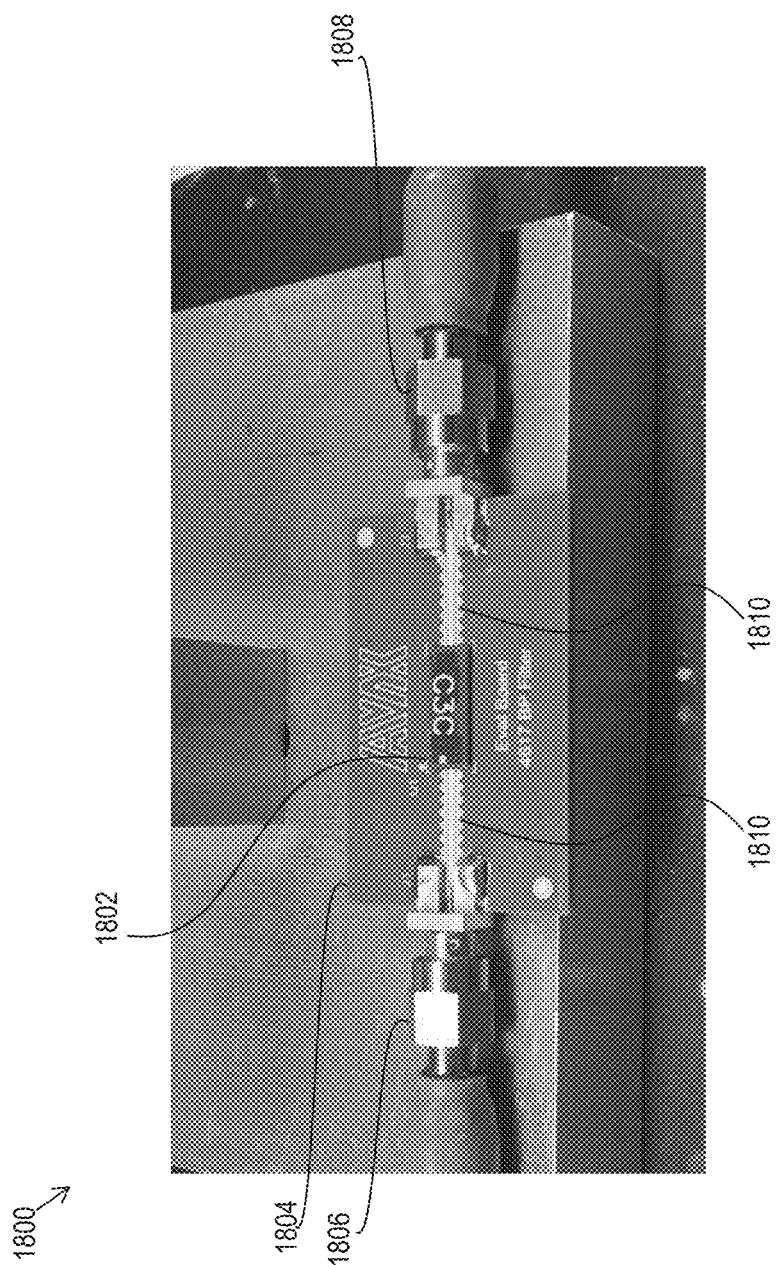
FIG. 18 is a perspective view of a testing assembly including a filter according to aspects of the present disclosure.

Referring to FIG. 18, a testing assembly 1800 can be used to test performance characteristics, such as insertion loss and return loss, of a multilayer filter 1802 according to aspects of the present disclosure. The filter 1802 can be mounted to a test board 1804. An input line 1806 and an output line 1808 were each connected with the test board 1804. The test board 1804 may include microstrip lines 1810 electrically connecting the input line 1806 with an input of the filter 1802 and electrically connecting the output line 1808 with an output of the filter 1802. An input signal was applied to the input line using a source signal generator (e.g., an 1806 Keithley 2400 series Source Measure Unit (SMU), for example, a Keithley 2410-C SMU) and the resulting output of the filter 1802 was measured at the output line 1808 (e.g., using the source signal generator). This was repeated for various configurations of the filter.

These and other modifications and variations of the present disclosure may be practiced by those of ordinary skill in the art, without departing from the spirit and scope of the present disclosure. In addition, it should be understood that aspects of the various embodiments may be interchanged both in whole and in part. Furthermore, those of ordinary skill in the art will appreciate that the foregoing description is by way of example only, and is not intended to limit the disclosure so further described in such appended claims.

What is claimed is:

1. A multilayer filter comprising:
   a plurality of dielectric layers stacked in a Z-direction that is perpendicular to each of a first direction and a second direction, the first direction being perpendicular to the second direction;
   a signal path having an input and an output, the signal path comprising a first conductive layer overlying one of the plurality of dielectric layers, the first conductive layer of the signal path being elongated in the first direction, the first conductive layer of the signal path having a first edge aligned with the first direction and a second edge parallel with the first edge, and wherein the first conductive layer of the signal path comprises a protrusion extending in the second direction and located between the first edge and the second edge in the first direction, and wherein the protrusion has an end edge that is parallel with the first edge and offset from the first edge in the second direction by a protrusion length that is greater than about 50 microns; and
   an inductor comprising a second conductive layer electrically connected at a first location with the signal path and electrically connected at a second location with at least one of the signal path or a ground.

2. The multilayer filter of claim 1, wherein a distance between the second edge and the first edge in the second direction is less than about 200 microns.

3. The multilayer filter of claim 1, wherein the protrusion has a first side edge that is parallel with the second direction and extends between the end edge and the first edge.

4. The multilayer filter of claim 3, wherein the signal path comprises a vertical electrical connection between the input and the first conductive layer, and wherein a distance in the first direction between the vertical electrical connection and the first side edge of the protrusion is less than about 500 microns.

5. The multilayer filter of claim 4, wherein the vertical electrical connection path comprises a via.

6. The multilayer filter of claim 3, wherein the protrusion has a second side edge that is parallel with the second direction and extends between the end edge and the second edge.

7. The multilayer filter of claim 6, wherein the second side edge is spaced apart from the first side edge by a protrusion width that is greater than about 50 microns.

8. The multilayer filter of claim 1, wherein the first conductive layer is free of electrical connections at the protrusion.

9. The multilayer filter of claim 1, wherein a length-to-width ratio of the protrusion ranges from about 0.2 to about 2.

10. The multilayer filter of claim 1, wherein a second-to-first width ratio of the protrusion ranges from about 1.05 to about 3.

11. The multilayer filter of claim 1, wherein the protrusion is spaced apart in the Z-direction from other conductive layers by at least about 30 microns.

12. The multilayer filter of claim 1, further comprising a via electrically connecting the inductor at the first location with the signal path.

13. The multilayer filter of claim 1, wherein the multilayer filter has a pass band frequency range and exhibits a return loss at a frequency within the pass band frequency range that is less than −20 dB.

14. The multilayer filter of claim 13, wherein the pass band frequency range has a lower bound that is greater than about 6 GHz.

15. The multilayer filter of claim 1, wherein the multilayer filter has a characteristic frequency that is greater than about 6 GHz.

16. The multilayer filter of claim 15, wherein the characteristic frequency comprises at least one of a low pass frequency, a high pass frequency, or an upper bound of a bandpass frequency.

17. The multilayer filter of claim 1, further comprising a dielectric material having a dielectric constant that is less than about 100 as determined in accordance with ASTM D2149-13 at an operating temperature of 25° C. and frequency of 1 kHz.

18. The multilayer filter of claim 1, further comprising a dielectric material having a dielectric constant that is greater than about 100 as determined in accordance with ASTM D2149-13 at an operating temperature of 25° C. and frequency of 1 kHz.

19. The multilayer filter of claim 1, further comprising a dielectric material that comprises an epoxy.

20. The multilayer filter of claim 1, further comprising an organic dielectric material.

21. The multilayer filter of claim 1, wherein the organic dielectric material comprises at least one of liquid crystalline polymer or polyphenyl ether.

22. A method of forming a multilayer filter, the method comprising:

forming a signal path comprising a first conductive layer overlying a first dielectric layer, the first conductive layer being elongated in the first direction, the first conductive layer having a first edge aligned with the first direction and a second edge parallel with the first edge, and wherein the first conductive layer comprises a protrusion extending in the second direction and located between the first edge and the second edge in the first direction, and wherein the protrusion has an end edge that is parallel with the first edge and offset from the first edge in the second direction by a protrusion length that is greater than about 50 microns; and forming an inductor comprising a second conductive layer overlying a second dielectric layer;

stacking the first and second dielectric layers such that the inductor is electrically connected at a first location with the signal path and electrically connected at a second location with at least one of the signal path or a ground.

23. The method of claim 22, further comprising forming a via in the first dielectric layer that forms at least a part of a vertical electrical connection between the input and the first conductive layer, and wherein a distance in the first direction between the vertical electrical connection and the first side edge of the protrusion is less than about 500 microns.

* * * * *